(12) United States Patent
Takagi

(10) Patent No.: US 6,472,685 B2
(45) Date of Patent: *Oct. 29, 2002

(54) SEMICONDUCTOR DEVICE

(75) Inventor: Takeshi Takagi, Kyoto (JP)

(73) Assignee: Matsushita Electric Industrial Co., Ltd., Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 159 days.

(21) Appl. No.: 09/203,098

(22) Filed: Dec. 2, 1998

(65) Prior Publication Data

US 2002/0011628 A1 Jan. 31, 2002

(30) Foreign Application Priority Data

Dec. 3, 1997 (JP) ............................................. 9-332726

(51) Int. Cl.[7] ............................................... H01L 31/0312
(52) U.S. Cl. .................... 257/77; 257/289; 257/369; 257/371
(58) Field of Search ..................... 157/77, 289, 369, 157/371

(56) References Cited

U.S. PATENT DOCUMENTS

| | | | |
|---|---|---|---|
| 4,885,614 A | | 12/1989 | Furukawa et al. |
| 5,241,214 A | * | 8/1993 | Herbots et al. ............. 257/649 |
| 5,442,205 A | * | 8/1995 | Brasen et al. ............... 257/191 |
| 5,561,302 A | * | 10/1996 | Candelaria ................... 257/24 |
| 6,190,975 B1 | * | 2/2001 | Kubo et al. .................. 438/285 |

FOREIGN PATENT DOCUMENTS

| | | |
|---|---|---|
| EP | 0 703 628 A2 | 3/1996 |
| EP | 0 829 908 A2 | 3/1998 |
| JP | 9-82944 | 3/1997 |

OTHER PUBLICATIONS

H.J. Osten et al., "Ternary SiGeC alloys: growth and properties of a new semiconducting material", Thin Solid Films 294, pp. 93–97, 1997.
M. Kim et al., "X–ray photoelectron spectroscopic evaluation of valence band offsets for strained $Si_{1-x}Ge_x$, $Si_{1-y}C_y$, and $Si_{1-x-y}Ge_xC_y$ on Si(001)", Appl. Phys. Lett., vol. 70, No. 20, pp. 2702–2704, May 19, 1997.
W. Faschinger et al., "Electrical properties of $Si_{1-x}C_x$ alloys and modulation doped $Si/Si_{1-x}C_x/Si$ structures", Appl. Phys. Lett., vol. 67, No. 67, No. 26, pp. 3933–3935, Dec. 25, 1995.
K. Rim et al., "Enhanced Hole Mobilities in Surface–channel Strained–Si p–MOSFETs", IEDM 95, pp. 517–520, 1995.
J. Welser et al., "Strain Dependence of the Performance Enhancement in Strained–Si n–MOSFETs", IEDM 94, pp. 373–376, 1994.

* cited by examiner

*Primary Examiner*—Sara Crane
(74) *Attorney, Agent, or Firm*—Eric J. Robinson; Nixon Peabody LLP

(57) ABSTRACT

A first silicon layer (Si layer), a second silicon layer ($Si_1C_y$ layer) containing carbon and a third silicon layer not containing carbon are stacked in this order on a silicon substrate. Since the lattice constant of the $Si_{1-y}C_y$ layer is smaller than that of the Si layer, the conduction band and the valence band of the second silicon layer receive a tensile strain to be split. Electrons having a smaller effective mass, which have been induced by an electric field applied to a gate electrode, are confined in the second silicon layer, and move in the channel direction. Thus, an n-MOSFET having extremely high mobility can be obtained. Furthermore, if the second silicon layer is made of $Si_{1-x-y}Ge_xC_y$, a structure suitable for a high-performance CMOS device can be formed. A high-performance field effect transistor can be provided at lower costs by using a heterojunction structure mainly composed of silicon.

8 Claims, 17 Drawing Sheets

SEMICONDUCTOR DEVICE

BACKGROUND OF THE INVENTION

The present invention relates to a semiconductor device including a field effect transistor, and more particularly relates to an improved semiconductor device in which the mobility of carriers is increased by applying a tensile strain to a channel layer where carriers are moving.

Currently, the majority of transistors formed on a silicon substrate are metal-insulator-semiconductor (MIS) field effect transistors. Methods for enhancing the performance characteristics of an MIS transistor by applying a tensile strain to an Si channel layer were reported by J. Welser et al. in "Strain Dependence of the Performance Enhancement in Strained-Si n-MOSFETs", IEDM Tech. Dig. 1994, p. 373, and by K. Rim et al. in "Enhanced Hole Mobilities in Surface-channel Strained-Si p-MOSFETs", IEDM Tech. Dig. 1995, p. 517.

FIG. 16 is a cross-sectional view illustrating a basic structure of a semiconductor region in a field effect transistor formed by these methods. As shown in FIG. 16, the semiconductor region basically includes: an SiGe buffer layer 101, in which the content of Ge linearly increases from 0 to x; an $Si_{1-x}Ge_x$ layer 102, the lattice strain of which has been relaxed; and an Si layer 103, which has received a tensile strain. These layers are stacked in this order on a silicon substrate 100. In this structure, the lattice strain of the $Si_{1-x}Ge_x$ layer 102, formed on the SiGe buffer layer 101, is relaxed such that the lattice constant of the $Si_{1-x}Ge_x$ layer 102 increases to match with that of the non-strained SiGe layer 101. And a tensile strain is applied to the Si layer 103 grown thereon.

FIG. 17(a) is a crystal structure diagram illustrating the lattice states of an $Si_{1-x}Ge_x$ layer and an Si layer before these layers are stacked one upon the other. FIG. 17(b) is a crystal structure diagram illustrating a state where the Si layer has received a tensile strain after these layers have been stacked. And FIG. 17(c) is a band diagram illustrating a heterojunction structure consisting of the $Si_{1-x}Ge_x$ layer and the Si layer. As shown in FIG. 17(a), the lattice constant of Si crystals is smaller than that of $Si_{1-x}Ge_x$ crystals. Thus, if the Si layer is epitaxially grown on the $Si_{1-x}Ge_x$ layer, the Si layer receives a tensile strain from the $Si_{1-x}Ge_x$ layer as shown in FIG. 17(b). As a result, the energy band of the heterojunction structure consisting of the $Si_{1-x}Ge_x$ layer and the Si layer, which has received the tensile strain, is as shown in FIG. 17(c). Specifically, since the Si layer has received a tensile strain, the sixfold degeneracy is dissolved in the conduction band, which is split into a twofold degenerate band Δ(2) and a fourfold degenerate band Δ(4). On the other hand, the twofold degeneracy is also dissolved in the valence band, which is split into a light-hole band LH and a heavy-hole band HH.

That is to say, in such a heterojunction structure, the edge of the conduction band in the Si layer 103 shown in FIG. 16 is the twofold degenerate band Δ(2), and has smaller energy than that of electrons in the $Si_{1-x}Ge_x$ layer 102. Thus, if a field effect transistor is formed by using the Si layer 103 as a channel, then electrons, having a smaller effective mass in the band Δ(2), move through the channel. As a result, the horizontal mobility of electrons increases in the Si layer 103 and the operating speed of the transistor also increases. In addition, the energy level of the band Δ(2) is lower than that at the edge of the conduction band in the $Si_{1-x}Ge_x$ layer 102. Thus, if the Si layer 103 is used as a channel, electrons can be confined in the Si layer by utilizing a heterobarrier formed between the Si and $Si_{1-x}Ge_x$ layers.

On the other hand, the edge of the valence band of the Si layer 103 is a band of light holes having a smaller effective mass, which have smaller energy than that of holes in the $Si_{1-x}Ge_x$ layer 102. Thus, if such an Si layer 103 is used as a channel region for a p-channel transistor, then the light holes, having a smaller effective mass, horizontally move in the Si layer 103. As a result, the mobility of holes increases and the operating speed of the transistor also increases.

As reported, in both n- and p-channel field effect transistors, the performance characteristics thereof can be enhanced by using an Si layer 103, which has received a tensile strain, as a channel region.

However, these field effect transistors, formed by the conventional methods, have the following problems.

Firstly, in order to apply a tensile strain to the Si layer 103 functioning as a channel region, the SiGe buffer layer 101 should be grown on the silicon substrate 100 until the layer 103 becomes thick enough to reduce the lattice strain of the $Si_{1-x}Ge_x$ layer 102. However, when the lattice strain of the $Si_{1-x}Ge_x$ layer 102 is relaxed, a large number of dislocation are generated in the SiGe buffer layer 101. A great number of dislocations are also present in the Si layer 103 formed on the $Si_{1-x}Ge_x$ layer 102. The dislocations such as these not only deteriorate the performance characteristics of the transistor, but also seriously affect the long-term reliability thereof. For example, it was reported that the dislocations could be reduced by modifying the structure of the SiGe buffer layer. However, in accordance with current techniques, the density of dislocations cannot be reduced to lower than about $10^5$ cm$^{-2}$. Such a device must be said to have very many defects.

Secondly, the buffer layer, provided for reducing the lattice strain, should be formed sufficiently thick (e.g., 1 μm or more). Thus, it takes a great deal of time to form such a layer by crystal growth. In view of the throughput of a device, such a structure is far from fully practical.

Thirdly, in the conventional structure, the energy level at the edge of the valence band in the Si layer 103 is lower than the energy level at the edge of the valence band in the $Si_{1-x}Ge_x$ layer 102. Thus, a heterobarrier, where the $Si_{1-x}Ge_x$ layer 102 is located at a higher level, is formed, and it cannot be expected that holes, having a smaller effective mass, are confined in the Si layer 103.

SUMMARY OF THE INVENTION

In view of these problems, the present invention was made to provide a sufficiently reliable, high-performance transistor by applying a tensile strain to a channel layer mainly composed of silicon, without providing any thick buffer layer for reducing a lattice strain, in which a large number of dislocations exist.

The semiconductor device of the present invention includes a field effect transistor on a substrate. The field effect transistor includes: a first silicon layer formed on the substrate; a second silicon layer, which is formed on the first silicon layer, contains carbon and has received a tensile strain from the first silicon layer; and a gate electrode formed over the second silicon layer. The second silicon layer functions as a channel region of the field effect transistor.

In this semiconductor device, since carbon, having a smaller atomic diameter than that of silicon, is contained in the second silicon layer, the lattice constant of the second silicon layer is smaller than that of the first silicon layer.

Accordingly, even if no thick buffer layer is provided between the first and second silicon layers, the second silicon layer containing carbon receives a tensile strain from the first silicon layer. As a result, in the second silicon layer, the sixfold degeneracy is dissolved in the conduction band, which is split into a twofold degenerate band and a fourfold degenerate band. The edge of the conduction band in the channel region formed out of the second silicon layer is the twofold degenerate band. The effective mass of twofold degenerate electrons is smaller than that of electrons in the first silicon layer. Thus, if current is horizontally supplied, the effective mass of electrons decreases on the plane and the mobility of electrons increases. In addition, since the distance between these two split bands is greater, the scattering between the valleys of these bands can be suppressed. Accordingly, the mobility of electrons further increases. As a result, the operating speed of a field effect transistor, including an n-channel where electrons move, increases. Also, the energy level of the twofold degenerate band in the second silicon layer is lower than that at the edge of the conduction band in the first silicon layer. Thus, in this structure, electrons can be confined in the second silicon layer by the heterobarrier formed between the first and second silicon layers.

On the other hand, in the second silicon layer, the degeneracy is also dissolved in the valence band, which is split into a light-hole band and a heavy-hole band. The edge of the valence band in the channel region formed out of the second silicon layer is the band consisting of light holes having a smaller effective mass. The effective mass of the light holes is smaller than that of holes in the first silicon layer. Thus, in a field effect transistor having a p-channel where holes move, the effective mass of holes decreases and the mobility of holes increases. As a result, the operating speed of the transistor increases.

Also, the energy level of the light-hole band is higher than that at the edge of the valence band in the first silicon layer. Thus, in this structure, light holes can be confined in the second silicon layer by a heterobarrier-formed between the first and second silicon layers.

Furthermore, since the second silicon layer does not have to be thick, a crystal layer having almost no dislocations can be easily formed by controlling the thickness at a critical thickness thereof or less, for example. Moreover, since no thick buffer layer is required for reducing the lattice strain, the throughput can also be increased. Accordingly, a highly reliable, high-performance semiconductor device functioning as a field effect transistor can be obtained at a lower cost.

In one embodiment of the present invention, if the field effect transistor is an n-channel field effect transistor, the second silicon layer is an n-channel where electrons move.

In another embodiment of the present invention, electrons are preferably confined by a heterobarrier formed between the first and second silicon layers of the n-channel field effect transistor.

In such an embodiment, a field effect transistor, in which electrons can be confined by the heterobarrier more efficiently, is obtained.

In still another embodiment, the semiconductor device preferably further includes a heavily doped layer, which is formed in the first silicon layer in the vicinity of the second silicon layer and contains a high-concentration n-type dopant.

In such an embodiment, the heavily doped layer for supplying carriers is spatially separated from the channel functioning as a carrier-accumulating layer. Thus, the carriers, moving through the channel, are not scattered by the ionized impurities, and therefore can move at a high velocity.

In still another embodiment, it is more preferable that the second silicon layer is a quantum well.

In such an embodiment, carriers, which have been induced in the second silicon layer functioning as a channel region, are confined in the quantum well and do not get over the heterobarrier even when the carrier density is high. As a result, the carriers move stably.

In still another embodiment, the semiconductor device may further include a third silicon layer, which is formed on the second silicon layer and under the gate electrode and applies a tensile strain to the second silicon layer. Electrons may be confined in the second silicon layer by a potential well formed in a boundary between the second and third silicon layers.

In such an embodiment, a channel where electrons move exists under the third silicon layer, not under the gate insulating film. Accordingly, the electrons, moving through the channel, are hardly scattered by an interface level existing in the interface between the gate insulating film and the third silicon layer or by the roughness of the interface. As a result, a higher operating speed is ensured as compared with a general MOS transistor.

In this case, the semiconductor device preferably further includes a heavily doped layer, which is formed in the third silicon layer in the vicinity of the second silicon layer and contains a high-concentration n-type dopant.

In still another embodiment, the semiconductor device may further include a third silicon layer, which is formed on the second silicon layer and under the gate electrode and applies a tensile strain to the second silicon layer. Electrons may be confined in the second silicon layer by a heterobarrier formed between the first and second silicon layers and another heterobarrier formed between the second and third silicon layers.

In such an embodiment, a heterobarrier is also formed between the second and third silicon layers. Accordingly, electrons can be confined very efficiently in the second silicon layer interposed between the heterobarrier formed between the first and second silicon layers and the heterobarrier formed between the second and third silicon layers.

In still another embodiment, if the field effect transistor is a p-channel field effect transistor, the second silicon layer is a p-channel where holes move.

In this case, holes are preferably confined by a heterobarrier formed between the first and second silicon layers of the p-channel field effect transistor.

In such an embodiment, a field effect transistor, in which holes can be confined by the heterobarrier very efficiently, is obtained.

In still another embodiment, the semiconductor device preferably further includes a heavily doped layer, which is formed in the first silicon layer in the vicinity of the second silicon layer and contains a high-concentration p-type dopant.

In such an embodiment, the heavily doped layer for supplying carriers is spatially separated from the channel functioning as a carrier-accumulating layer. Thus, the carriers, moving through the channel, are not scattered by the ionized impurities, and therefore can move at a high velocity.

In the same way as the n-channel field effect transistor, it is more preferable that the second silicon layer is a quantum well.

In still another embodiment, the p-channel field effect transistor may further include a third silicon layer, which is formed on the second silicon layer and under the gate electrode and applies a tensile strain to the second silicon layer. Holes may be confined in the second silicon layer by a potential well formed in a boundary between the second and third silicon layers.

In this case, the semiconductor device preferably further includes a heavily doped layer, which is formed in the third silicon layer in the vicinity of the second silicon layer and contains a high-concentration p-type dopant.

In still another embodiment, the p-channel field effect transistor may further include a third silicon layer, which is formed on the second silicon layer and under the gate electrode and applies a tensile strain to the second silicon layer. Holes may be confined in the second silicon layer by a heterobarrier formed between the first and second silicon layers and another heterobarrier formed between the second and third silicon layers.

In these three embodiments, the same effects as those described above are attained, whereby a field effect transistor, in which holes can be confined very efficiently, is obtained.

In still another embodiment, the semiconductor device preferably further includes a gate insulating film formed just under the gate electrode.

In still another embodiment, the thickness of the second silicon layer is preferably smaller than a critical thickness, which is determined by the composition of carbon and above which dislocations are generated.

In such an embodiment, the second silicon layer may be composed of crystals having no dislocations and excellent crystallinity. Thus, it is possible to prevent the electrical characteristics of a field effect transistor from being deteriorated owing to the existence of high-density dislocations.

In still another embodiment, the second silicon layer may further contain germanium.

In such an embodiment, carbon, having a smaller atomic diameter than that of silicon, is contained together with germanium in the second silicon layer. Thus, if the compositions of carbon and germanium are adjusted, it is easy to set the lattice constant of the second silicon layer at a value smaller than that of the first silicon layer. Accordingly, even if no thick buffer layer is provided between the first and second silicon layers, the second silicon layer can receive a tensile strain from the first silicon layer. As a result, the above effects can be attained. In addition, the following effects can also be attained.

Specifically, the energy level difference between the light-hole band in the second silicon layer, containing carbon and germanium and having received a tensile strain, and the edge of the valence band in the first silicon layer is larger than the energy level difference between the light-hole band in the second silicon layer, containing carbon and having received a tensile strain, and the edge of the valence band in the first silicon layer. Thus, holes are expectedly confined more effectively. In addition, by changing the compositions of germanium and carbon, the heights of the heterobarriers at the edges of the valence band and the conduction band can be appropriately controlled depending on the type of the semiconductor device and so on.

In still another embodiment, the field effect transistor is an n-channel field effect transistor in which the second silicon layer is an n-channel. The semiconductor device further includes a p-channel field effect transistor. The p-channel field effect transistor includes: a fourth silicon layer formed on the substrate; a fifth silicon layer, which is formed on the fourth silicon layer, contains carbon and has received a tensile strain from the fourth silicon layer; and a gate electrode formed over the fifth silicon layer. The fifth silicon layer functions as a p-channel region. In this structure, the semiconductor device can function as a complementary device.

In such an embodiment, a p-channel field effect transistor including a p-channel, where the mobility of holes is high, and an n-channel field effect transistor including an n-channel, where the mobility of electrons is high, can be formed by using a multilayer film in common. In a conventional semiconductor device, a channel region functioning only as a p-channel, where the mobility of holes is high, and another channel region functioning only as an n-channel, where the mobility of electrons is high, should be stacked one upon the other. In such a case, in one of the channel regions, sufficient field effects cannot be attained, because the channel region is more distant from the gate electrode. In the structure of the present invention, however, such an inconvenience can be avoided.

In still another embodiment of the semiconductor device functioning as a complementary device, carbon contained in the second silicon layer of the n-channel field effect transistor preferably has an equal composition to that of carbon contained in the fifth silicon layer of the p-channel field effect transistor.

In such an embodiment, the second silicon layer of the n-channel field effect transistor and the fifth silicon layer of the p-channel field effect transistor can be formed during the same growth process step. As a result, the fabrication process can be simplified and the fabrication costs can be further cut down.

In still another embodiment, the semiconductor device functioning as a complementary device preferably further includes a gate insulating film formed just under the gate electrode. And the thickness of the fifth silicon layer is preferably smaller than a critical thickness, which is determined by the composition of carbon and above which dislocations are generated.

In still another embodiment, the second and fifth silicon layers may further contain germanium.

In such an embodiment, by changing the compositions of germanium and carbon, the heights of the heterobarriers at the edges of the valence band and the conduction band can be appropriately controlled depending on the type of the semi-conductor device and so on. Thus, a channel that can confine carriers with high efficiency can be formed by using the same structure in common, no matter whether the channel is n-type or p-type.

In this case, germanium contained in the second silicon layer preferably has an equal composition to that of germanium contained in the fifth silicon layer.

In such an embodiment, the second silicon layer of the n-channel field effect transistor and the fifth silicon layer of the p-channel field effect transistor can be formed during the same growth process step. As a result, the fabrication process can be simplified and the fabrication costs can be further cut down.

DESCRIPTION OF THE PREFERRED EMBODIMENTS

EMBODIMENT 1

Figure 1:
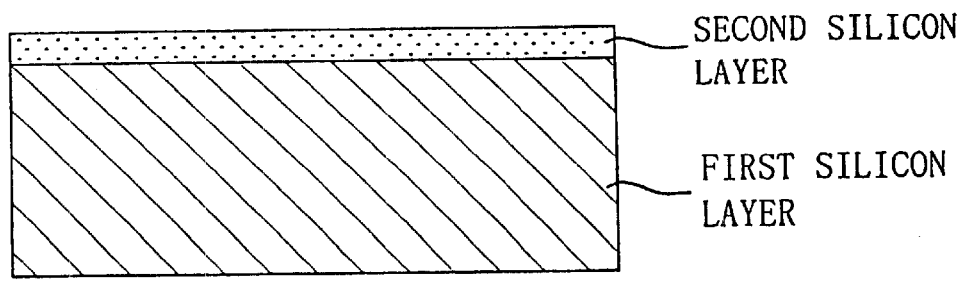
FIG. 1 is a cross-sectional view illustrating the basic structure of the present invention, in which a second silicon layer (i.e., an $Si_{1-y}C_y$ or $Si_{1-x-y}Ge_xC_y$ layer) containing carbon (or carbon and germanium) and having received a tensile strain is formed on a first silicon layer (Si layer).

FIG. 1 is a cross-sectional view illustrating an extracted multilayer structure consisting of a first silicon layer (Si layer) and a second silicon layer (i.e., an $Si_{1-y}C_y$ or $Si_{1-x-y}Ge_xC_y$ layer) containing carbon (or carbon and germanium) in order to explain the basic feature of the present invention.

Figure 2A:
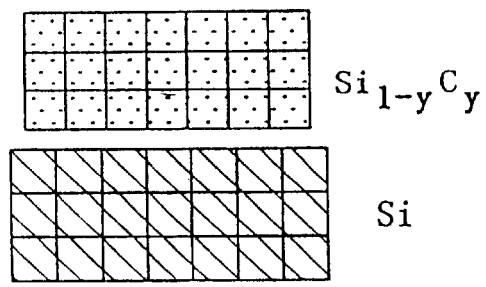
FIG. 2(a) is a crystal structure diagram illustrating the lattice states of Si and $S_{1-y}C_y$ layers before these layers are stacked one upon the other in the first to third embodiments.
Figure 2B:
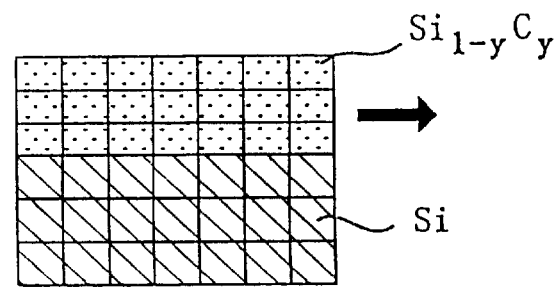
FIG. 2(b) is a crystal structure diagram illustrating a state where the $Si_{1-y}C_y$ layer has received a tensile strain after these layers have been stacked.
Figure 2C:
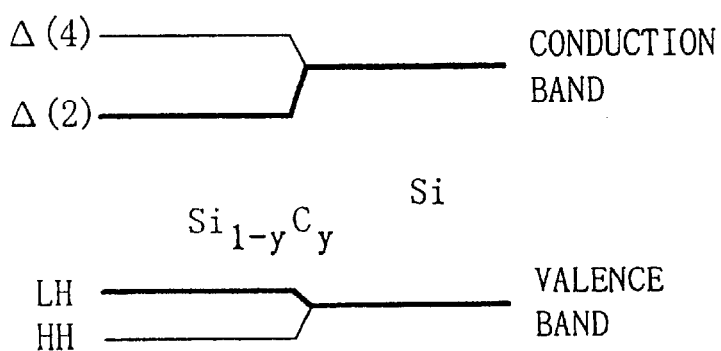
FIG. 2(c) is a band diagram illustrating a heterojunction structure of the Si and $Si_{1-y}C_y$ layers.

FIG. 2(a) is a crystal structure diagram illustrating the lattice states of a first silicon layer (the Si layer) not containing carbon and a second silicon layer (the $Si_{1-y}C_y$ layer) containing carbon before these layers are stacked one upon the other in the first to third embodiments. FIG. 2(b) is a crystal structure diagram illustrating a state where the $Si_{1-y}C_y$ layer has received a tensile strain after these layers have been stacked. And FIG. 2(c) is a band diagram illustrating a heterojunction structure of the Si and $Si_{1-y}C_y$ layers that have been stacked.

As shown in FIG. 2(a), the lattice constant of the silicon layer containing carbon, i.e., $Si_{1-y}C_y$ layer, is smaller than that of Si layer, because the atomic diameter of carbon is smaller than that of silicon. Thus, if the $Si_{1-y}C_y$ layer is stacked on the Si layer, the $Si_{1-y}C_y$ layer receives a tensile strain from the Si layer as shown in FIG. 2(b). In particular, if the $Si_{1-y}C_y$ layer has a thickness equal to or smaller than the critical thickness thereof at which dislocations are generated, the $Si_{1-y}C_y$ layer receives a large tensile strain from the Si layer. And the energy band of the heterojunction structure consisting of the Si and $Si_{1-y}C_y$ layers is as shown in FIG. 2(c).

Specifically, in the $Si_{1-y}C_y$ layer, the sixfold degeneracy is dissolved in the conduction band, which is split into a twofold degenerate band $\Delta(2)$ and a fourfold degenerate band $\Delta(4)$. In this case, the edge of the conduction band in the $Si_{1-y}C_y$ layer is the twofold degenerate band $\Delta(2)$, where the effective mass of electrons is smaller than that of electrons in the Si layer. Also, the energy level of the twofold degenerate band $\Delta(2)$ is lower than that at the edge of the conduction band in the Si layer. Accordingly, electrons can be confined by a heterobarrier formed between the second silicon layer ($Si_{1-y}C_y$ layer) and the first silicon layer (Si layer).

On the other hand, in the $Si_{1-y}C_y$ layer, the twofold degeneracy is also dissolved in the valence band, which is split into a light-hole band LH and a heavy-hole band HH. In this case, the edge of the valence band in the $Si_{1-y}C_y$ layer is the band consisting of light holes having a smaller effective mass. The effective mass of the light holes is smaller than that of holes in the Si layer. Thus, the energy level of the light-hole band is higher than that of Si in the valence band. Accordingly, holes can be confined by a heterobarrier formed between the second silicon layer ($Si_{1-y}C_y$ layer) and the first silicon layer (Si layer).

Figure 3:
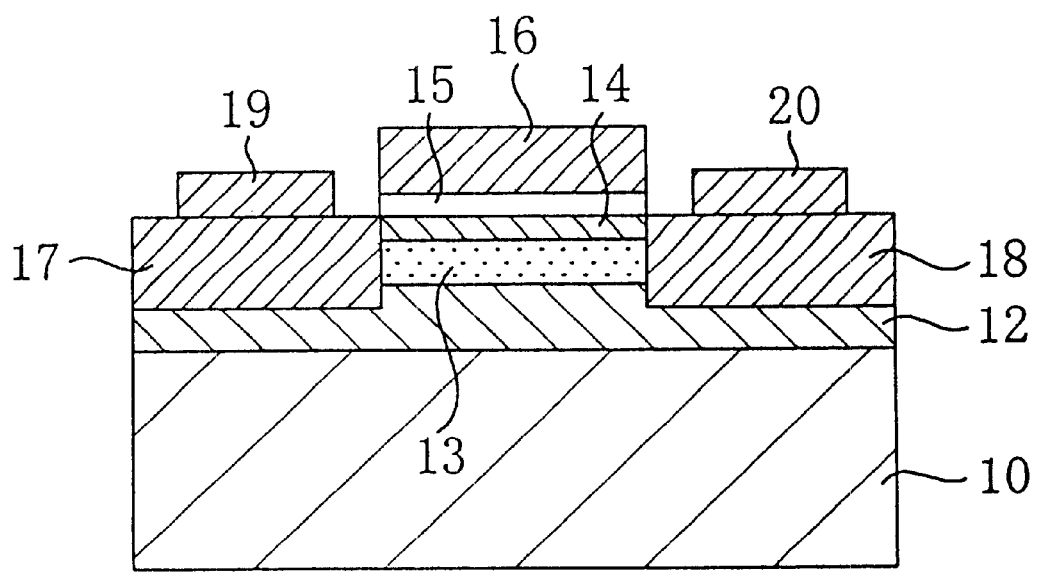
FIG. 3 is a cross-sectional view illustrating the structure of an n-MOSFET of the first embodiment in which a second silicon layer, containing carbon and having received a tensile strain, is used as an n-channel.

FIG. 3 is a cross-sectional view illustrating the structure of an n-MOSFET of the first embodiment in which the silicon layer containing carbon functions as an n-channel.

As shown in FIG. 3, a first silicon layer 12 (Si layer), a second silicon layer 13 containing carbon ($Si_{1-y}C_y$ layer) and a third silicon layer 14 not containing carbon are stacked in this order by a UHV-CVD technique on a p-type silicon substrate 10. The second silicon layer 13 containing carbon functions as a channel region where electrons move.

Figure 5:
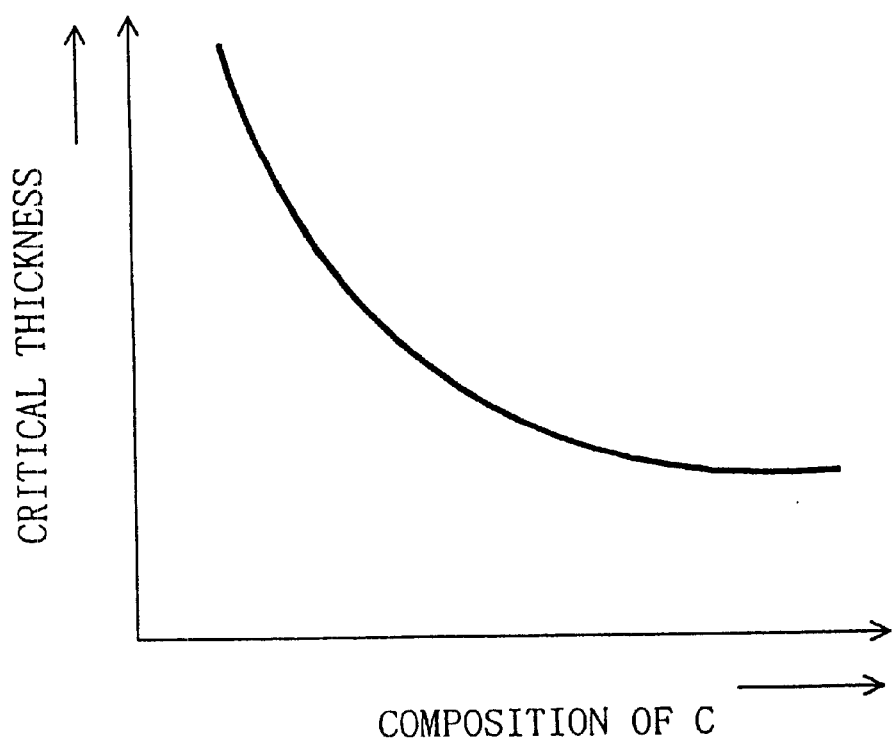
FIG. 5 is a graph showing how the thickness of the second silicon layer, which is formed on the first silicon layer, contains carbon and has received a tensile strain, should be changed with the composition of carbon in order not to generate dislocations in the second silicon layer.

FIG. 5 is a graph showing how the critical thickness Tc of a silicon layer, containing carbon and formed on a single crystalline silicon layer (not containing carbon), should be changed with the composition of carbon in order not to generate dislocations therein. The thickness of the second silicon layer 13 is preferably set at the critical thickness Tc or less such that dislocations are not generated because of a strain. Thus, in this embodiment, the content of carbon in the second silicon layer 13 is set at 2% and the thickness thereof is set at 10 nm.

On the third silicon layer 14, a gate insulating film 15 is formed out of a silicon dioxide film by thermally oxidizing the third silicon layer 14. And on the gate insulating film 15, a gate electrode 16 is formed. On both sides below the gate electrode 16, source/drain regions 17 and 18 are formed as $n^+$ layers. And on the source/drain regions 17 and 18, source/drain electrodes 19 and 20 are formed, respectively.

Figure 4A:
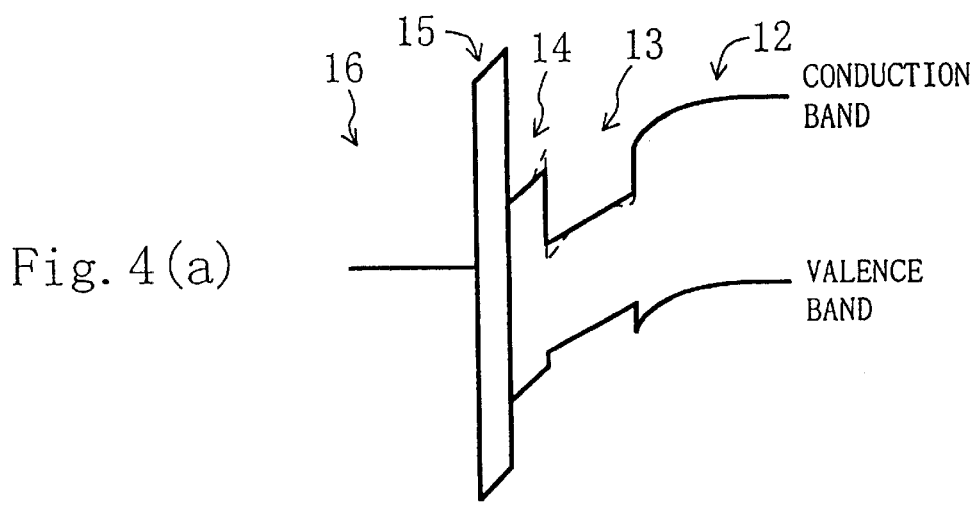
FIG. 4(a) is a band diagram where a positive voltage has been applied to the gate electrode of the n-MOSFET in the first embodiment.
Figure 4B:
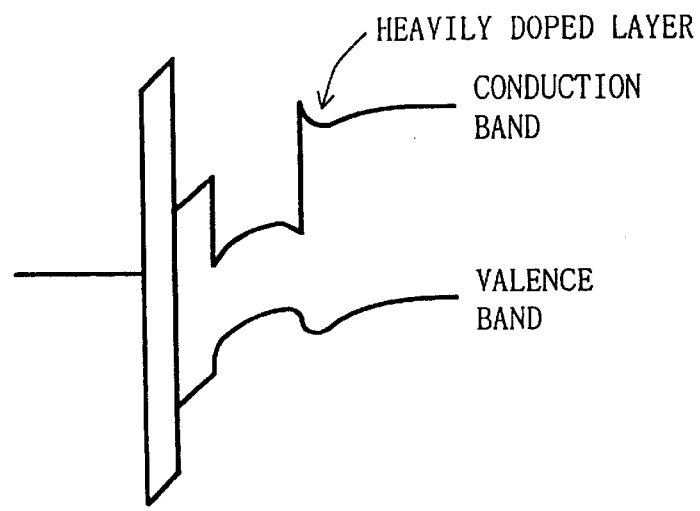
FIG. 4(b) is a band diagram where a heavily doped layer is further provided for the first silicon layer.
Figure 4C:
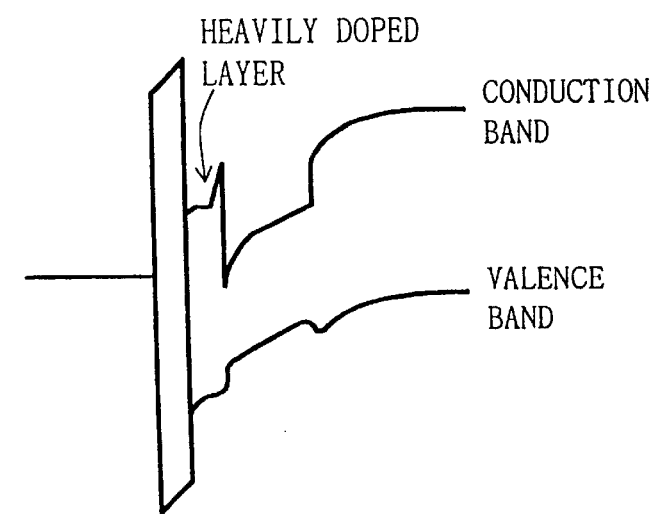
FIG. 4(c) is a band diagram where a heavily doped layer is further provided for the third silicon layer.

FIGS. 4(a) through 4(c) are diagrams illustrating the band structure of the first, second and third silicon layers 12, 13, 14, the gate insulating film 15 and the gate electrode 16, where the n-MOSFET shown in FIG. 3 is operated by applying a positive voltage to the gate electrode 16. In FIG. 4(a), the band structure is illustrated by the solid line in a simplified shape. However, in actuality, the edge of the conduction band is shaped as indicated by the broken line in FIG. 4(a). FIG. 4(b) illustrates a band structure where a heavily doped layer is further provided for the first silicon layer 12, and FIG. 4(c) illustrates a band structure where a heavily doped layer is further provided for the third silicon layer 14. Electrons, which have been induced by the electric field applied to the gate electrode 16, are mainly confined in the second silicon layer 13, which is a channel region containing carbon and having received a tensile strain. As a result, the electrons move in a direction vertical to the paper sheet (i.e., a channel direction) of FIGS. 4(a) through 4(c).

That is to say, in this embodiment, electrons are confined in the second silicon layer 13 by a heterobarrier formed between the first and second silicon layers 12, 13 and a heterobarrier formed between the second and third silicon layers 13, 14. And since the effective mass of the electrons moving in this direction is small as described above, the mobility of the electrons and the operating speed of the transistor increase as a result. Also, in the second silicon layer 13 functioning as a channel region, the degeneracy is dissolved in the conduction band, which is split into bands $\Delta(2)$ and $\Delta(4)$. Accordingly, the scattering of the electrons between the valleys of these bands can be suppressed. Thus, it is expected that the mobility can be further increased.

Furthermore, in this embodiment, a quantum well structure, in which the second silicon layer 13 as a channel region is interposed between the first and third silicon layers 12 and 14, each having a large band gap, is formed. Thus, the induced electrons are confined in the quantum well, do not get over the heterobarriers and move stably even when the density of electrons is high. That is to say, a high-performance n-MOSFET having a quantum well structure can be provided using less expensive materials than compound semi-conductors such as GaAs.

In this embodiment, a buried-channel MOSFET, in which the second silicon layer 13 is provided as a channel region, where electrons move, under the third silicon layer 14, has been described. Alternatively, a surface-channel MOSFET, which does not include the third silicon layer 14 and in which the gate insulating film 15 is directly deposited or formed by thermal oxidation on the second silicon layer 13 as a channel region, may also be formed. Even in such a case, electrons can also be confined in the second silicon layer 13 by the heterobarrier formed between the first and second silicon layers 12, 13 and the gate insulating film 15. And, carriers can still be confined with higher efficiency than an ordinary MOSFET and the effective mass of the electrons on the band $\Delta(2)$, formed by the dissolved degeneracy, is still smaller than usual. Accordingly, the operating speed can be increased, too.

Moreover, an energy level well, where electrons can be accumulated, is formed between the first and second silicon layers 12 and 13 as indicated by the broken line in FIG. 4(a). Another energy level well, where electrons can be accumulated, is also formed between the second and third silicon layers 13 and 14.

And if a heavily doped layer, containing a high-concentration dopant for carriers, is formed in a region closer to the heterobarrier between the first and second silicon layers 12, 13, then one of the two energy level wells can be used as a carrier-accumulating layer. As a result, a so-called high electron mobility transistor (HEMT) may be formed (see FIG. 4(b)). In such a case, the heavily doped layer for supplying carriers is spatially separated from the channel functioning as a carrier-accumulating layer. Thus, the carriers, moving through the channel, are not scattered by the ionized impurities, and therefore can move at a high velocity.

However, in the energy band structure shown in FIG. 4(b), it depends on the level of the voltage applied to the gate electrode 16 which of the two wells constitutes a carrier-accumulating layer. Specifically, if the voltage applied to the gate electrode 16 is relatively high, the energy level well between the second and third silicon layers 13 and 14 constitutes a carrier-accumulating layer. Alternatively, if the voltage applied to the gate electrode 16 is relatively low, the energy level well between the first and second silicon layers 12 and 13 constitutes a carrier-accumulating layer.

Furthermore, if the voltage applied to the gate electrode 16 is an intermediate value, any of these two energy level wells can be a carrier-accumulating layer.

On the other hand, if a heavily doped layer, containing a high-concentration dopant for carriers, is formed in a region closer to the heterobarrier between the second and third silicon layers 13, 14, then an HEMT, in which the energy level well between the second and third silicon layers 13, 14 constitutes a carrier-accumulating layer, is formed (see FIG. 4(c)). In such a case, the velocity of moving carriers can also be increased because of the same reason as that described above.

If the heavily doped layer is formed in the third silicon layer 14 (see FIG. 4(c)), the heavily doped layer itself might be a channel depending on specific operating conditions, i.e., the dopant concentrations and thicknesses of the respective silicon layers 12 to 14 and the heavily doped layer and the voltage applied to the gate electrode 16. Thus, the heavily doped layer may be selectively formed either in the first silicon layer 12 or the third silicon layer 14 in accordance with the structures of respective parts and the operating conditions of a field effect transistor.

Also, the energy level well (i.e., the portion indicated by the broken line in FIG. 4(a)) between the second and third silicon layers 13, 14 may be used as a channel, not as a carrier-accumulating layer. In such a case, a channel where electrons move exists just under the third silicon layer 14, not under the gate insulating film 15.

In a general MOS transistor, a channel region exists just under a gate insulating film. Thus, electrons, moving through the channel, are scattered by the roughness of, or by an interface level existing in, the surface of a silicon layer in contact with the gate insulating film. As a result, the mobility of the electrons decreases. In contrast, in the structure of this embodiment, almost no interface levels exist between the second and third silicon layers 13, 14. In addition, the surface of the second silicon layer 13 is flat, because, in general, the second and third silicon layers 13, 14 are formed continuously by epitaxy. As a result, the mobility of the electrons moving through the channel increases.

That is to say, a higher operating speed is ensured as compared with a general MOS transistor.

EMBODIMENT 2

Figure 6:
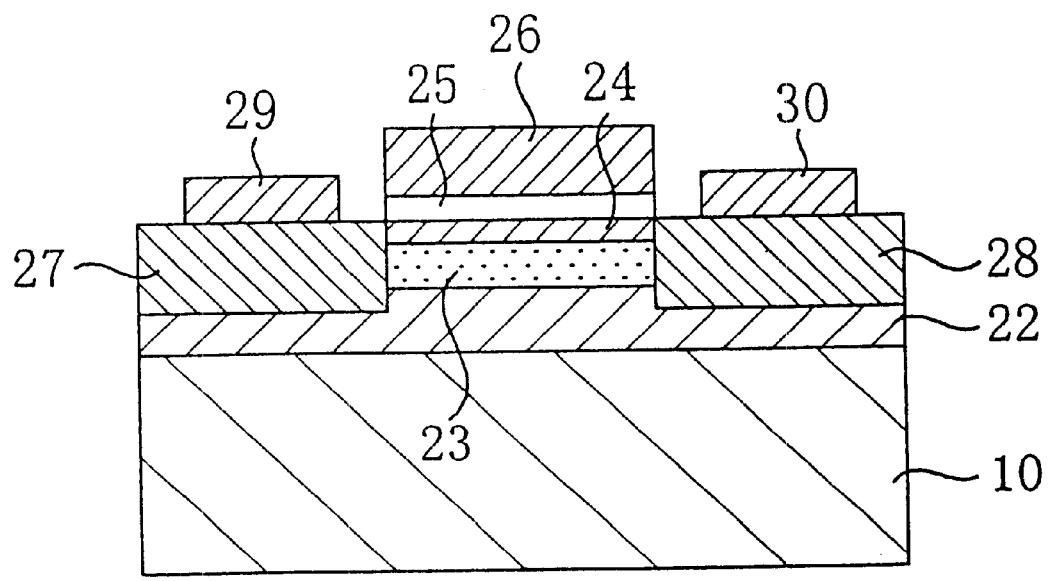
FIG. 6 is a cross-sectional view illustrating the structure of a p-MOSFET of the second embodiment in which a second silicon layer, containing carbon and having received a tensile strain, is used as a p-channel.

FIG. 6 is a cross-sectional view illustrating the structure of a p-MOSFET of the second embodiment in which a silicon layer containing -carbon is used as a p-channel.

As shown in FIG. 6, a first silicon layer 22, a second silicon layer 23 containing carbon and a third silicon layer 24 not containing carbon are stacked in this order by a UHV-CVD technique on an n-type silicon substrate 10. The second silicon layer 23 containing carbon functions as a channel region where holes move. In this embodiment, the thickness of the second silicon layer 23 is also preferably set at the critical thickness Tc or less such that dislocations are not generated because of a strain. Thus, in this embodiment, the content of carbon in the second silicon layer 23 is set at 2% and the thickness thereof is set at 10 nm.

On the third silicon layer 24, a gate insulating film 25 is formed out of a silicon dioxide film by thermally oxidizing the third silicon layer 24. On the gate insulating film 25, a gate electrode 26 is formed. On both sides below the gate electrode 26, source/drain regions 27 and 28 are formed as $p^+$ layers. And on the source/drain regions 27 and 28, source/drain electrodes 29 and 30 are formed, respectively.

In this case, as shown in FIG. 1 and FIGS. 2(a) through 2(c) in the first embodiment, the lattice constant of the second silicon layer 23 containing carbon is smaller than that of the first silicon layer 22 not containing carbon. Thus, the second silicon layer 23 receives a tensile strain. As a result, the valence band of the second silicon layer 23 is split into a light-hole band LH and a heavy-hole band HH as shown in FIG. 2(c). In this case, the edge of the valence band of the second silicon layer 23 containing carbon is the band consisting of light holes having a smaller effective mass. The effective mass of the light holes is smaller than that of holes in the first silicon layer 22. Thus, if a p-MOSFET is formed using the second silicon layer 23 having such a band structure as a channel region, then the mobility of holes increases, because the effective mass of the holes is smaller. As a result, the operating speed of the transistor increases. In addition, since the energy level of the LH band is higher than that at the edge of the valence band in the first silicon layer 22, a heterobarrier for confining holes having a smaller effective mass is formed in the second silicon layer 23.

Figure 7A:
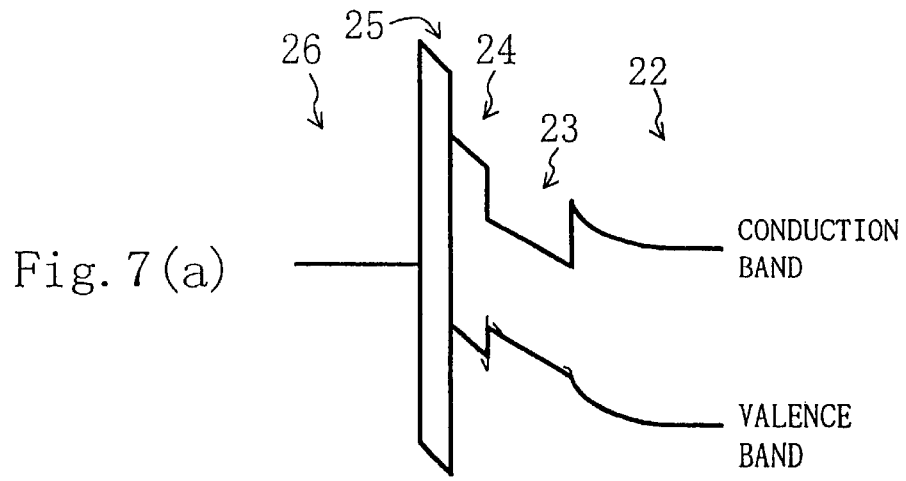
FIG. 7(a) is a band diagram where a negative voltage has been applied to the gate electrode of the p-MOSFET in the second embodiment.
Figure 7B:
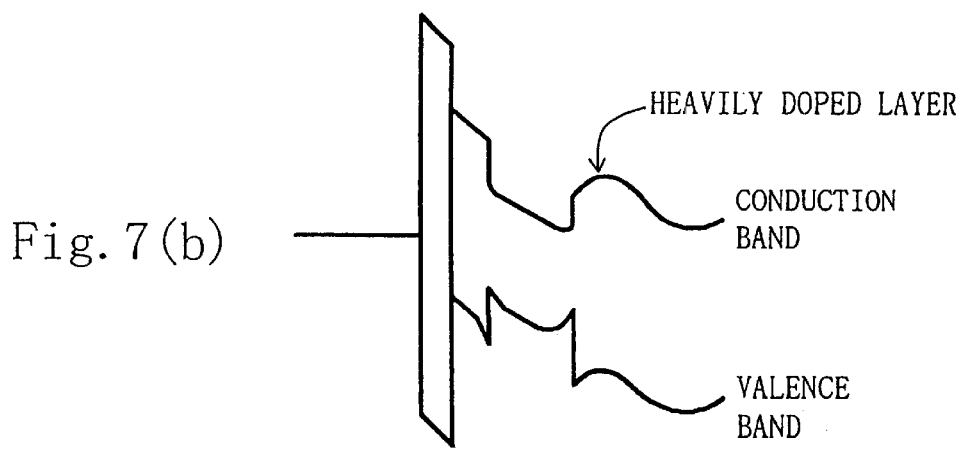
FIG. 7(b) is a band diagram where a heavily doped layer is further provided for the first silicon layer.
Figure 7C:
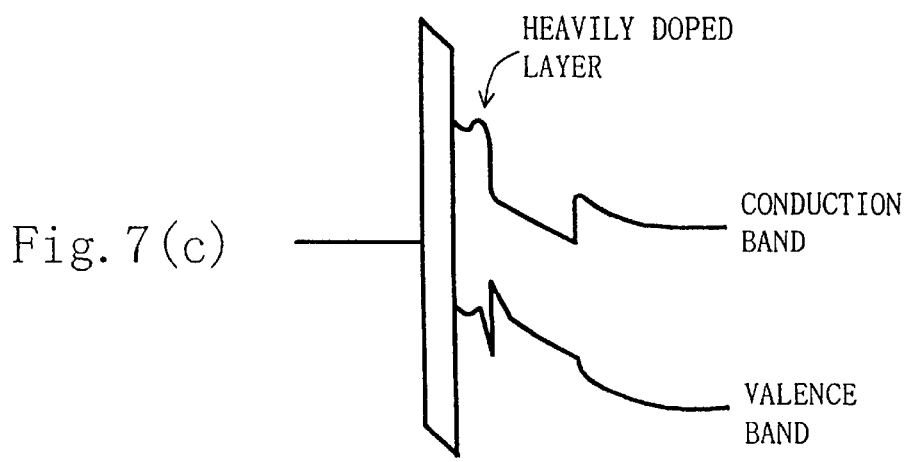
FIG. 7(c) is a band diagram where a heavily doped layer is further provided for the third silicon layer.

FIGS. 7(a) through 7(c) are diagrams illustrating the band structure of the first, second and third silicon layers 22, 23, 24, the gate insulating film 25 and the gate electrode 26, where the p-MOSFET shown in FIG. 6 is operated by applying a negative voltage to the gate electrode 26. In FIG. 7(a), the band structure is illustrated by the solid line in a simplified shape. However, in actuality, the edge of the valence band is shaped as indicated by the broken line in FIG. 7(a). FIG. 7(b) illustrates a band structure where a heavily doped layer is further provided for the first silicon layer 22, and FIG. 7(c) illustrates a band structure where a heavily doped layer is further provided for the third silicon layer 24. Holes, which have been induced by the electric field applied to the gate electrode 26, are mainly confined in the second silicon layer 23, which is a channel region containing carbon and having received a tensile strain. As a result, the holes move in a direction vertical to the paper sheet of FIGS. 7(a) through 7(c) (i.e., a channel direction). That is to say, in this embodiment, holes are confined in the second silicon layer 23 by a heterobarrier formed between the first and second silicon layers 22, 23 and a heterobarrier formed between the second and third silicon layers 23, 24. And since the edge of the valence band in the second silicon layer 23 containing carbon and having received a tensile strain is an LH band having a smaller effective mass as described above, the mobility of the holes and the operating speed of the transistor increases as a result.

Furthermore, in this embodiment, a quantum well structure, in which the second silicon layer 23 as a channel region is interposed between the first and third silicon layers 22 and 24, each having a large band gap, is formed. Thus, the induced electrons are confined in the quantum well, do not get over the heterobarriers and move stably even when the density of holes is high. That is to say, a high-performance p-MOSFET having a quantum well structure can be provided using less expensive materials than compound semiconductors such as GaAs.

In this embodiment, a buried-channel MOSFET, in which the second silicon layer 23 is provided as a channel region, where holes move, under the third silicon layer 24, has been described. Alternatively, a surface-channel MOSFET, which does not include the third silicon layer 24 and in which the gate insulating film 25 is directly deposited or formed by thermal oxidation on the second silicon layer 23 as a channel region, may also be formed. Even in such a case, holes can also be confined in the second silicon layer 23 by the heterobarrier formed between the first and second silicon layers 22, 23 and the gate insulating film 25. And, carriers can still be confined with higher efficiency than an ordinary MOSFET and the effective mass of the light holes, formed by the dissolved degeneracy, is still smaller than usual. Accordingly, the operating speed can be increased, too.

Moreover, an energy level well, where holes can be accumulated, is formed between the first and second silicon layers 22 and 23 as indicated by the broken line in FIG. 7(*a*). Another energy level well, where holes can be accumulated, is also formed between the second and third silicon layers 23 and 24.

And if a heavily doped layer, containing a high-concentration dopant for carriers, is formed in a region closer to the heterobarrier between the first and second silicon layers 22, 23, then one of the two energy level wells can be used as a carrier-accumulating layer. As a result, a so-called high electron mobility transistor (HEMT) may be formed (see FIG. 7(*b*)). In such a case, the heavily doped layer for supplying carriers is spatially separated from the channel functioning as a carrier-accumulating layer. Thus, the carriers, moving through the channel, are not scattered by the ionized impurities, and therefore can move at a high velocity.

However, in the energy band structure shown in FIG. 7(*b*), it depends on the level of the voltage applied to the gate electrode 26 which of the two wells constitutes a carrier-accumulating layer. Specifically, if the voltage applied to the gate electrode 26 is relatively high, the energy level well between the second and third silicon layers 23 and 24 constitutes a carrier-accumulating layer. Alternatively, if the voltage applied to the gate electrode 26 is relatively low, the energy level well between the first and second silicon layers 22 and 23 constitutes a carrier-accumulating layer. Furthermore, if the voltage applied to the gate electrode 26 is an intermediate value, any of these two energy level wells can be a carrier-accumulating layer.

On the other hand, if a heavily doped layer, containing a high-concentration dopant for carriers, is formed in a region closer to the heterobarrier between the second and third silicon layers 23, 24, then an HEMT, in which the energy level well between the second and third silicon layers 23, 24 constitutes a carrier-accumulating layer, is formed (see FIG. 7(*c*)). In such a case, the velocity of moving carriers can also be increased because of the same reason as that described above.

If the heavily doped layer is formed in the third silicon layer 24 (see FIG. 7(*c*)), the heavily doped layer itself might be a channel depending on specific operating conditions, i.e., the dopant concentrations and thicknesses of the respective silicon layers 22 to 24 and the heavily doped layer and the voltage applied to the gate electrode 26. Thus, the heavily doped layer may be selectively formed either in the first silicon layer 22 or the third silicon layer 24 in accordance with the structures of respective parts and the operating conditions of a field effect transistor.

Also, the energy level well (a portion indicated by the broken line in FIG. 7(*a*)) between the second and third silicon layers 23, 24 may be used as a channel, not as a carrier-accumulating layer. In such a case, a channel where holes move exists just under the third silicon layer 24, not under the gate insulating film 25.

In a general MOS transistor, a channel region exists just under a gate insulating film. Thus, holes, moving through the channel, are scattered by the roughness of, or by an interface level existing in, the surface of a silicon layer in contact with the gate insulating film. As a result, the mobility of the holes decreases. In contrast, in the structure of this embodiment, almost no interface levels exist between the second and third silicon layers 23, 24. In addition, the surface of the second silicon layer 23 is flat, because, in general, the second and third silicon layers 23, 24 are formed continuously by epitaxy. As a result, the mobility of the holes moving through the channel increases.

That is to say, a higher operating speed is ensured as compared with a general MOS transistor.

EMBODIMENT 3

Figure 8:
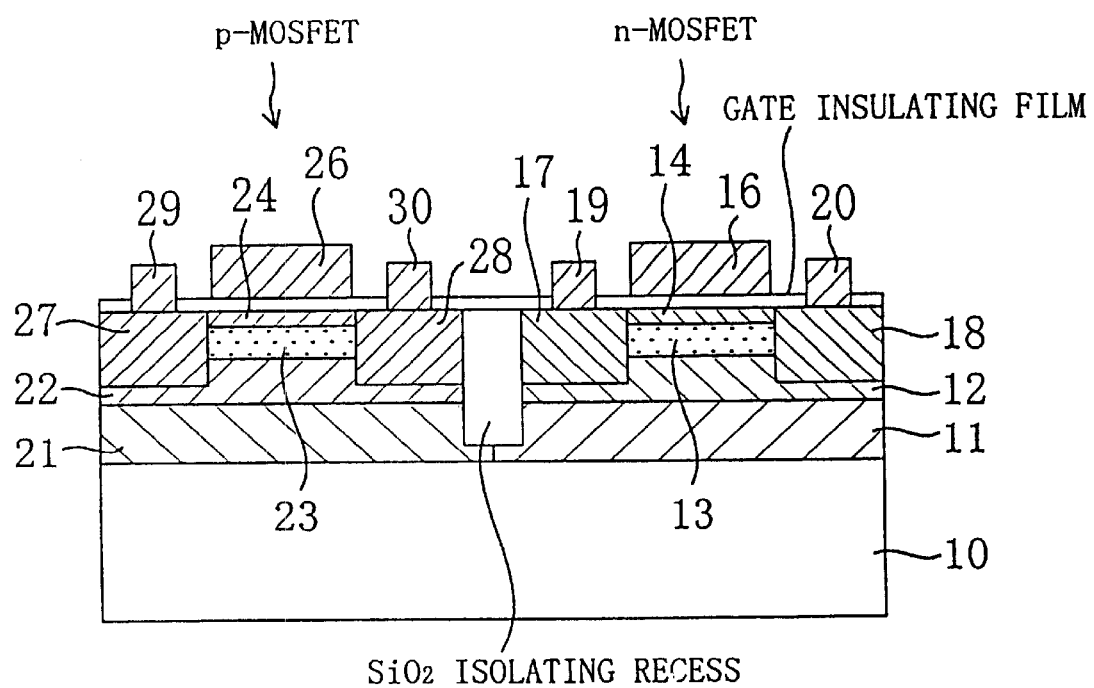
FIG. 8 is a cross-sectional view illustrating the structure of a CMOSFET, including n- and p-MOSFET's, of the third embodiment in which a second silicon layer, containing carbon and having received a tensile strain, is used as n- and p-channels.
Figure 9A:
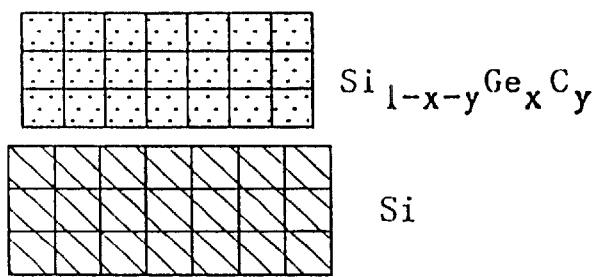
FIG. 9(a) is a crystal structure diagram illustrating the lattice states of Si and $Si_{1-x-y}Ge_xC_y$ layers before these layers are stacked one upon the other in the fourth to sixth embodiments.
Figure 9B:
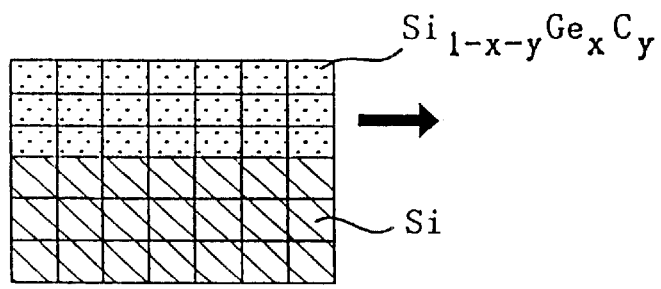
FIG. 9(b) is a crystal structure diagram illustrating a state where the $Si_{1-x-y}Ge_xC_y$ layer has received a tensile strain after these layers have been stacked.
Figure 9C:
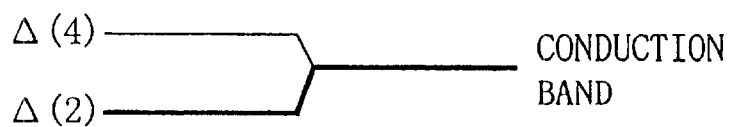
FIG. 9(c) is a band diagram illustrating a heterojunction structure of the Si and $Si_{1-x-y}Ge_xC_y$ layers.
Figure 9C:
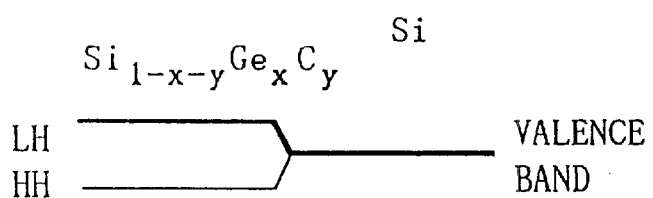

FIG. 8 is a cross-sectional view illustrating the structure of a CMOSFET, including n- and p-MOSFET's, of the third embodiment in which a silicon layer containing carbon is used as n- and p-channels.

The CMOSFET of this embodiment basically has a structure in which the n-MOSFET of the first embodiment and the p-MOSFET of the second embodiment are formed on the silicon substrate 10 to be adjacent to each other via an $SiO_2$ isolating well therebetween. As shown in FIG. 8, a p-well 11 is formed under the n-MOSFET and an n-well 21 is formed under the p-MOSFET.

In the n-MOSFET, the first silicon layer 12, the second silicon layer 13 containing carbon and the third silicon layer 14 not containing carbon are stacked in this order by a UHV-CVD technique on the p-well 11. The second silicon layer 13 containing carbon functions as an n-channel region where electrons move. The thickness of the second silicon layer 13 is preferably set at the critical thickness Tc or less such that dislocations are not generated because of a strain. Thus, in this embodiment, the content of carbon in the second silicon layer 13 is set at 2% and the thickness thereof is set at 10 nm. On the third silicon layer 14, a gate insulating film is formed out of a silicon dioxide film by thermally oxidizing the third silicon layer 14. On the gate insulating film, a gate electrode 16 is formed. On both sides below the gate electrode 16, source/drain regions 17 and 18 are formed as $n^+$ layers. And on the source/drain regions 17 and 18, source/drain electrodes 19 and 20 are formed, respectively.

On the other hand, in the p-MOSFET, the first silicon layer 22, the second silicon layer 23 containing carbon and the third silicon layer 24 not containing carbon are stacked in this order by a UHV-CVD technique on the n-well 21. The second silicon layer 23 containing carbon functions as a p-channel region where holes move. In the p-MOSFET, the content of carbon in the second silicon layer 23 is also set at 2% and the thickness thereof is also set at 10 nm. On the third silicon layer 24, a gate insulating film is formed out of a silicon dioxide film by thermally oxidizing the third silicon layer 24. On the gate insulating film, a gate electrode 26 is formed. On both sides below the gate electrode 26, source/drain regions 27 and 28 are formed as $p^+$ layers. And on the source/drain regions 27 and 28, source/drain electrodes 29 and 30 are formed, respectively.

In this embodiment, in both the n- and p-MOSFET's, channel regions where carriers move are formed out of the second silicon layers 13, 23 both containing carbon and having received a tensile strain.

As described in the first and second embodiments, the energy level at the edge of the conduction band is lower in the second silicon layer 13, 23, containing carbon and having received a tensile strain, than in the first silicon layer 12, 22 not containing carbon. On the other hand, the energy level at the edge of the valence band is higher in the second silicon layer 13, 23 than in the first silicon layer 12, 22. Thus, energy barriers for confining carriers in the second silicon layer 13, 23 are formed in both the conduction and valence bands. Accordingly, channel regions for confining both electrons and holes can be formed in the second silicon layers 13, 23.

In a conventional CMOSFET mainly composed of SiGe/Si and using a heterojunction structure (see Japanese Laid- Open Publication No. 61-282278, for example), a heterobarrier for confining electrons and holes in channel regions cannot be made of a single composition. Thus, crystalline layers, to be n- and p-channels, respectively, must be made of different compositions and these layers must be stacked one upon the other. However, in such a structure, the crystal growing process is adversely complicated and the throughput might decrease. Also, the lower one of the n- and p-channels is more distant from a gate insulating film. Thus, even if a voltage is applied to the gate, an electric field having a sufficiently high intensity might not reach the lower channel region. Moreover, since a thick buffer layer is indispensable for reducing the lattice strain, the conventional structure has problems in terms of reliability and throughput as mentioned above.

By contrast, in this embodiment, heterobarriers for confining carriers are formed in both the conduction and valence bands of the $Si_{1-y}C_y$ layer, which is formed on the Si layer and has received a tensile strain. Thus, the $Si_{1-y}C_y$ layer can be used both as n- and p-channels. In other words, the n- and p-channels, where electrons and holes respectively move at high velocities, can be formed in the second silicon layers 13 and 23. As a result, in either the n- or p-MOSFET, the second silicon layer 13, 23 to be a channel region can be formed in the vicinity of the gate insulating film. Accordingly, an electric field produced by the voltage applied to the gate electrode 16, 26 can be applied to the channel region with much more certainty. Furthermore, unlike the prior art, no thick buffer layer is required for reducing the lattice strain. Consequently, the crystal growing process step can be simplified during the fabrication process, and the reliability and throughput can be improved.

EMBODIMENT 4

In the following fourth to sixth embodiments, the basic heterojunction structure of the present invention shown in FIG. 1 is also employed. That is to say, in these embodiments, a second silicon layer made of $Si_{1-x-y}Ge_xC_y$ is supposed to be stacked on the first silicon layer made of Si.

FIG. 9(*a*) is a crystal structure diagram illustrating the lattice states of a first silicon layer not containing carbon (Si layer) and a second silicon layer containing carbon and germanium ($Si_{1-x-y}Ge_xC_y$ layer) before these layers are stacked one upon the other in the fourth to sixth embodiments. FIG. 9(*b*) is a crystal structure diagram illustrating a state where the $Si_{1-x-y}Ge_xC_y$ layer has received a tensile strain after these layers have been stacked. And FIG. 9(*c*) is a band diagram illustrating a heterojunction structure of the Si and $Si_{1-x-y}Ge_xC_y$ layers that have been stacked.

First, as shown in FIG. 9(*a*), if the relationship between the compositions x, y of germanium and carbon is represented as x<8.2y, then the lattice constant of the second silicon layer ($Si_{1-x-y}Ge_xC_y$ layer) containing carbon and germanium is smaller than that of the first silicon layer (Si layer). Thus, if the $Si_{1-x-y}Ge_xC_y$ layer is grown on the Si layer, the $Si_{1-x-y}Ge_xC_y$ layer receives a tensile strain as shown in FIG. 9(*b*). In particular, if the $Si_{1-x-y}Ge_xC_y$ layer has a thickness equal to or smaller than the critical thickness Tc thereof, the $Si_{1-x-y}Ge_xC_y$ layer receives a large tensile strain. Owing to the tensile strain, the degeneracy is dissolved in the conduction band of the $Si_{1-x-y}Ge_xC_y$ layer. As a result, the edge of the conduction band becomes Δ(2) as shown in FIG. 9(*c*). Consequently, band discontinuity is generated in the conduction band in the vicinity of the interface between the first and second silicon layers 52, 53.

Specifically, in the $Si_{1-x-y}Ge_xC_y$ layer, the sixfold degeneracy is dissolved in the conduction band, which is split into a twofold degenerate band Δ(2) and a fourfold degenerate band Δ(4). In this case, the edge of the conduction band in the $Si_{1-x-y}Ge_xC_y$ layer is the twofold degenerate band Δ(2), where the effective mass of electrons is smaller than that of electrons in the Si layer. Also, the energy level of the twofold degenerate band Δ(2) is lower than that at the edge of the conduction band in the Si layer. Accordingly, electrons can be confined by a heterobarrier formed between the second silicon layer ($Si_{1-x-y}Ge_xC_y$ layer) and the first silicon layer (Si layer).

On the other hand, in the $Si_{1-x-y}Ge_xC_y$ layer, the twofold degeneracy is also dissolved in the valence band, which is split into a light-hole band LH and a heavy-hole band HH. In this case, the edge of the valence band of the $Si_{1-x-y}Ge_xC_y$ layer is the band consisting of light holes having a smaller effective mass. The effective mass of the light holes is smaller than that of holes in the Si layer. Thus, the energy level of the light-hole band is higher than that of the valence band of Si. Accordingly, holes can be confined by a heterobarrier formed between the second silicon layer ($Si_{1-x-y}Ge_xC_y$ layer) and the first silicon layer (Si layer).

As described by K. Brunner. W. Winter, K. Eberl, N.Y. Jin-Phillipp and F. Phillipp in "Fabrication and Band Alignment of Pseudomorphic $Si_{1-y}C_y$, $Si_{1-x-y}Ge_xC_y$ and Coupled $Si_{1-y}C_y/Si_{1-x-y}Ge_xC_y$ Quantum Well Structures on Si Substrates", Journal of Crystal Growth 175/176 (1997), pp. 451–458, the height of the heterobarrier can be larger than the case using the second silicon layer not containing Ge ($Si_{1-y}C_y$ layer). For example, if the concentration of C is 6%, then the heights of heterobarriers formed at the edges of the conduction and valence bands are variable with the existence/absence of Ge (28%) as follows:

TABLE 1

|  | Heterobarrier at Edge of Conduction Band | Heterobarrier at Edge of Valence Band |
| --- | --- | --- |
| $Si_{0.94}C_{0.06}$/Si | 280 meV | 90 meV |
| $(Si_{0.7}Ge_{0.3})_{0.94}Cy_{0.06}$/Si | 145 meV | 125 meV |

That is to say, the heterobarrier becomes smaller at the edge of the conduction band and larger at the edge of the valence band. The heterobarrier may be larger in $Si_{1-x-y}Ge_xC_y$ having received a tensile strain than in $Si_{1-y}C_y$, having received a tensile strain. Thus, by making the second silicon layer of $Si_{1-x-y}Ge_xC_y$ having received a tensile strain, not $Si_{1-y}C_y$, holes can be confined more efficiently and a device is more suitable for high-speed operation.

Also, by changing the mole fractions x and y in $Si_{1-x-y}Ge_xC_y$, the ratio of the height of the heterobarrier at the edge of the conduction band to that at the edge of the valence band can be controlled at a desired value.

Figure 10:
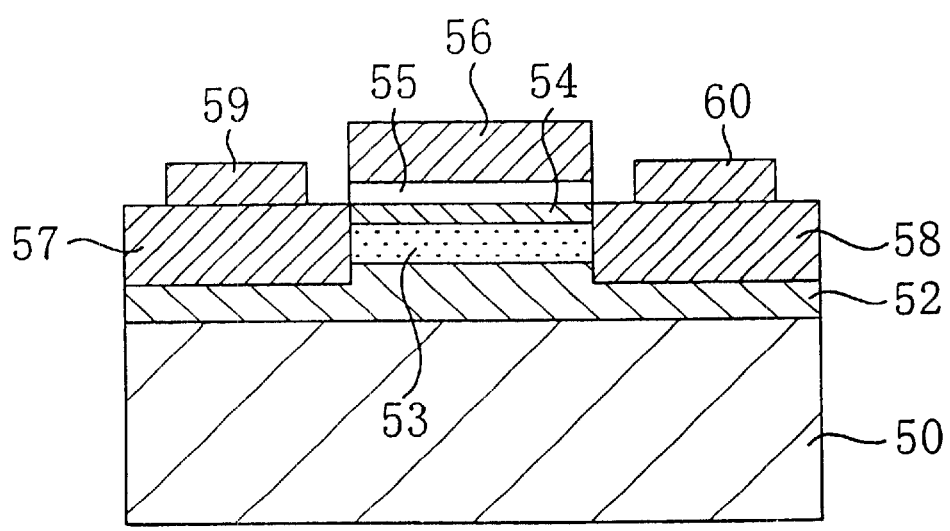
FIG. 10 is a cross-sectional view illustrating the structure of an n-MOSFET of the fourth embodiment in which a second silicon layer (i.e., $Si_{1-x-y}Ge_xC_y$ layer) containing carbon and germanium and having received a tensile strain is used as an n-channel.

FIG. 10 is a cross-sectional view illustrating the structure of an n-MOSFET of the fourth embodiment in which a silicon layer, containing carbon and germanium and having received a tensile strain, is used as a channel region.

As shown in FIG. 10, a first silicon layer 52 not containing carbon or germanium, a second silicon layer 53 containing carbon and germanium and having received a tensile strain, and a third silicon layer 54 not containing carbon or germanium are stacked in this order by a UHV-CVD technique on a p-type silicon substrate 50. The second silicon layer 53 containing carbon and germanium functions as a channel region where electrons move.

Figure 12:
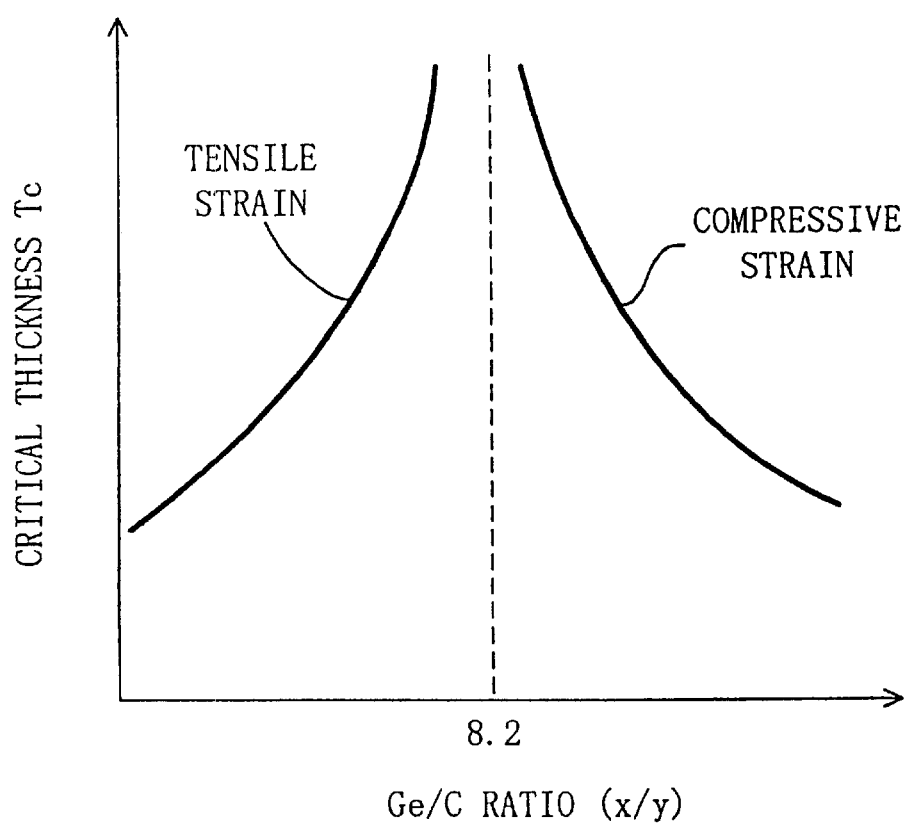
FIG. 12 is a graph showing how the thickness of the second silicon layer, which is formed on the first silicon layer, contains carbon and germanium and has received a tensile strain, should be changed with the compositions of carbon and germanium in order not to generate dislocations in the second silicon layer.

Hereinafter, the critical thickness of the second silicon layer 53 containing carbon and germanium will be described. FIG. 12 is a graph showing how the critical thickness Tc should be changed with the compositions of carbon and germanium in the second silicon layer 53 in order not to generate dislocations in the $Si_{1-x-y}Ge_xC_y$ layer. As shown in FIG. 12, the second silicon layer 53, which is formed on a single crystalline silicon layer not containing carbon and is represented by a formula $Si_{1-x-y}Ge_xC_y$ containing carbon and germanium, receives a tensile strain and has almost no dislocations if the relationship between the compositions x, y of germanium and carbon is represented as x<8.2y and the thickness thereof is the critical thickness Tc or less. In this embodiment, in order not to generate dislocations by setting the thickness of the second silicon layer 53 at the critical thickness Tc or less, the compositions of germanium and carbon in the second silicon layer 53 are set at 20% and 4%, respectively. And the thickness thereof is set at 10 nm.

On the third silicon layer 54, a gate insulating film 55 is formed out of a silicon dioxide film by thermally oxidizing the third silicon layer 54. On the gate insulating film 55, a gate electrode 56 is formed. On both sides below the gate electrode 56, source/drain regions 57 and 58 are formed as $n^+$ layers. And on the source/drain regions 57 and 58, source/drain electrodes 59 and 60 are formed, respectively. The electrons moving through the second silicon layer 53, which is a channel region containing carbon and germanium and having received a tensile strain, are controlled by the voltage applied to the gate electrode 56.

Figure 11A:
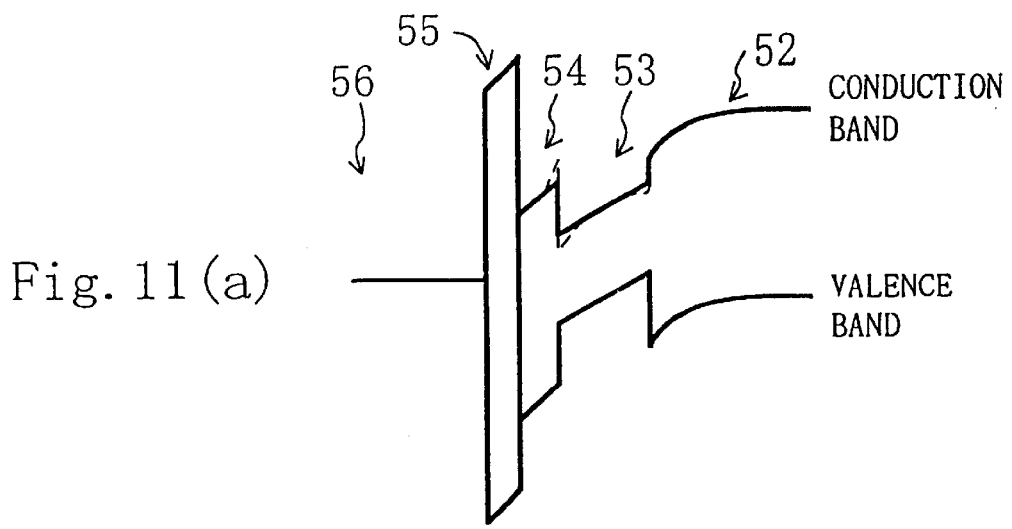
FIG. 11(a) is a band diagram where a positive voltage has been applied to the gate electrode of the n-MOSFET in the fourth embodiment.
Figure 11B:
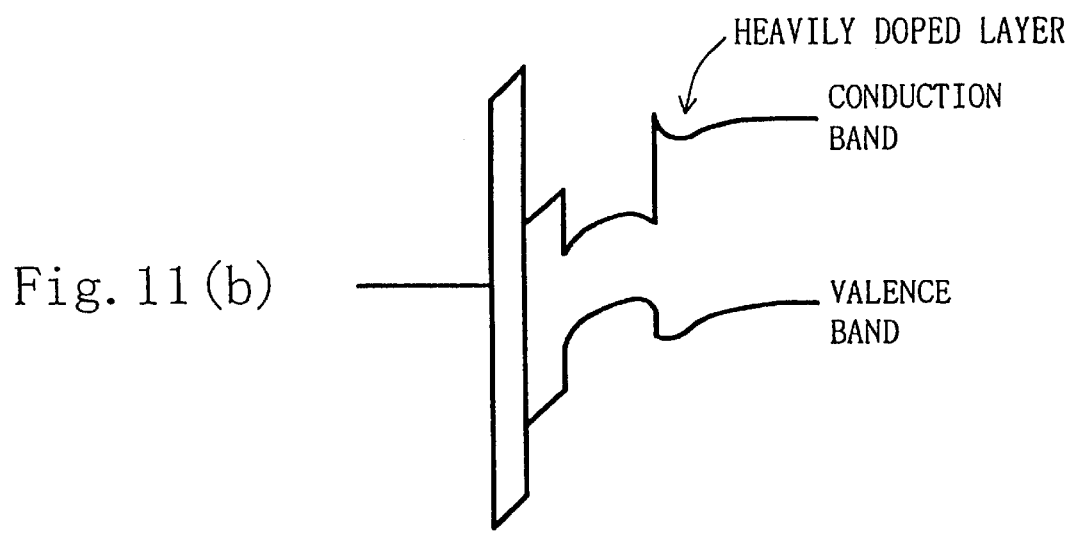
FIG. 11(b) is a band diagram where a heavily doped layer is further provided for the first silicon layer.
Figure 11C:
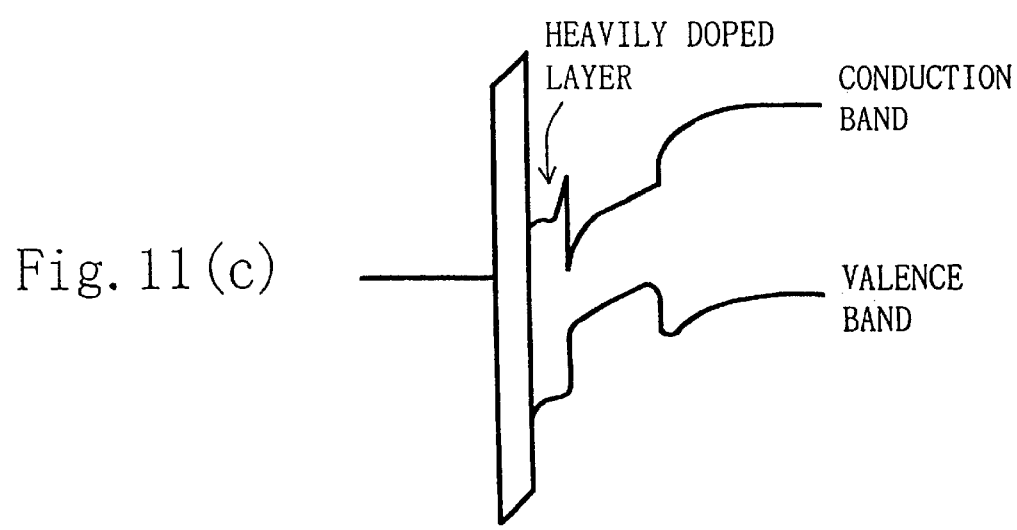
FIG. 11(c) is a band diagram where a heavily doped layer is further provided for the third silicon layer.

FIGS. 11(a) through 11(c) are diagrams illustrating the band structure of the first, second and third silicon layers 52, 53, 54, the gate insulating film 55 and the gate electrode 56, where the n-MOSFET shown in FIG. 10 is operated by applying a positive voltage to the gate electrode 56. In FIG. 11(a), the band structure is illustrated by the solid line in a simplified shape. However, in actuality, the edge of the conduction band is shaped as indicated by the broken line in FIG. 11(a). FIG. 11(b) illustrates a band structure where a heavily doped layer is further provided for the first silicon layer 52, and FIG. 11(c) illustrates a band structure where a heavily doped layer is further provided for the third silicon layer 54. Electrons, which have been induced by the electric field applied to the gate electrode 56, are mainly confined in the second silicon layer 53, which is a channel region containing carbon and germanium and having received a tensile strain. As a result, the electrons move in a direction vertical to the paper sheet of FIGS. 11(a) through 11(c) (i.e., a channel direction). That is to say, in this embodiment, electrons are confined in the second silicon layer 53 by a heterobarrier formed between the first and second silicon layers 52, 53 and a heterobarrier formed between the second and third silicon layers 53, 54. And since the effective mass of the electrons, moving in this direction, is small as described above, the mobility of the electrons and the operating speed of the transistor increase as a result. Also, in the second silicon layer 53 as a channel region, the degeneracy is dissolved in the conduction band, which is split into bands $\Delta(2)$ and $\Delta(4)$. Accordingly, the scattering of the electrons between the valleys of these bands can be suppressed. Thus, it is expected that the mobility can be further increased.

Furthermore, in this embodiment, a quantum well structure, in which the second silicon layer 53 as a channel region is interposed between the first and third silicon layers 52 and 54, each having a large band gap, is formed. Thus, the induced electrons are confined in the quantum well, do not get over the heterobarriers and move stably even when the density of electrons is high. That is to say, a high-performance n-MOSFET having a quantum well structure can be provided using less expensive materials than compound semi-conductors such as GaAs.

As can be understood, if the channel region of an n-MOSFET is formed out of the second silicon layer 53 containing carbon and germanium and having received a tensile strain, the operating speed of the n-MOSFET can be increased.

In this embodiment, a buried-channel MOSFET, in which the second silicon layer 53 is provided as a channel region, where electrons move, under the third silicon layer 54, has been described. Alternatively, a surface-channel MOSFET, which does not include the third silicon layer 54 and in which the gate insulating film 55 is directly deposited or formed by thermal oxidation on the second silicon layer 53 as a channel region, may also be formed. Even in such a case, electrons can also be confined in the second silicon layer 53 by the heterobarrier formed between the first and second silicon layers 52, 53 and the gate insulating film 55. And carriers can still be confined with higher efficiency than an ordinary MOSFET and the effective mass of the electrons on the band $\Delta(2)$, formed by the dissolved degeneracy, is still smaller than usual. Accordingly, the operating speed can be increased, too.

Moreover, an energy level well, where electrons can be accumulated, is formed between the first and second silicon layers 52 and 53 as indicated by the broken line in FIG. 11(a). Another energy level well, where electrons can be accumulated, is also formed between the second and third silicon layers 53 and 54.

And if a heavily doped layer, containing a high-concentration dopant for carriers, is formed in a region closer to the heterobarrier between the first and second silicon layers 52, 53, then one of the two energy level wells can be used as a carrier-accumulating layer. As a result, a so-called high electron mobility transistor (HEMT) may be formed (see FIG. 11(b)). In such a case, the heavily doped layer for supplying carriers is spatially separated from the channel functioning as a carrier-accumulating layer. Thus, the carriers, moving through the channel, are not scattered by the ionized impurities, and therefore can move at a high velocity.

However, in the energy band structure shown in FIG. 11(b), it depends on the level of the voltage applied to the gate electrode 56 which of the two wells constitutes a carrier-accumulating layer. Specifically, if the voltage applied to the gate electrode 56 is relatively high, the energy level well between the second and third silicon layers 53 and 54 constitutes a carrier-accumulating layer. Alternatively, if the voltage applied to the gate electrode 56 is relatively low, the energy level well between the first and second silicon layers 52 and 53 constitutes a carrier-accumulating layer. Furthermore, if the voltage applied to the gate electrode 56 is an intermediate value, any of these two energy level wells can be a carrier-accumulating layer.

On the other hand, if a heavily doped layer, containing a high-concentration dopant for carriers, is formed in a region closer to the heterobarrier between the second and third silicon layers 53, 54, then an HEMT, in which the energy level well between the second and third silicon layers 53, 54 constitutes a carrier-accumulating layer, is formed (see FIG. 11(c)). In such a case, the velocity of moving carriers can also be increased because of the same reason as that described above.

If the heavily doped layer is formed in the third silicon layer 54 (see FIG. 11(c)), the heavily doped layer itself might be a channel depending on specific operating conditions, i.e., the dopant concentrations and thicknesses of the respective silicon layers 52 to 54 and the heavily doped layer and the voltage applied to the gate electrode 56. Thus, the heavily doped layer may be selectively formed either in the first silicon layer 52 or the third silicon layer 54 in accordance with the structures of respective parts and the operating conditions of a field effect transistor.

Also, the energy level well (i.e., the portion indicated by the broken line in FIG. 11(a)) between the second and third silicon layers 53, 54 may be used as a channel, not as a carrier-accumulating layer. In such a case, a channel where electrons move exists just under the third silicon layer 54, not under the gate insulating film 55. Consequently, as described in the first embodiment, a higher operating speed is ensured as compared with a general MOS transistor.

EMBODIMENT 5

Figure 13:
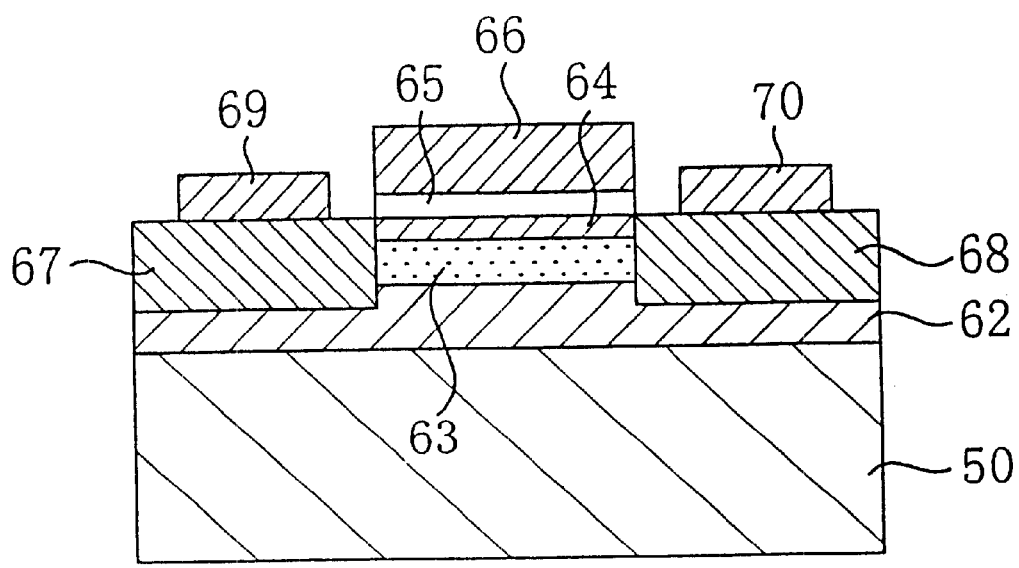
FIG. 13 is a cross-sectional view illustrating the structure of a p-MOSFET of the fifth embodiment in which a second silicon layer (i.e., $Si_{1-x-y}Ge_xC_y$ layer) containing carbon and germanium and having received a tensile strain is used as a p-channel.

FIG. 13 is a cross-sectional view illustrating the structure of a p-MOSFET of the fifth embodiment in which a silicon layer containing carbon and germanium and having received a tensile strain is used as a channel region.

As shown in FIG. 13, a first silicon layer 62 not containing carbon or germanium, a second silicon layer 63 containing carbon and germanium and having received a tensile strain, and a third silicon layer 64 not containing carbon or germanium are stacked in this order by a UHV-CVD technique on an n-type silicon substrate 50. The second silicon layer 63 containing carbon and germanium functions as a channel region where holes move.

As described above, the second silicon layer 63, which is formed on the Si layer not containing carbon and is represented by a formula $Si_{1-x-y}Ge_xC_y$ containing carbon and germanium, receives a tensile strain if the relationship between the compositions x, y of germanium and carbon is represented as x<8.2y. In order not to generate dislocations owing to a strain, the thickness of the second silicon layer 63 is set at the critical thickness Tc or less. Thus, in this embodiment, the compositions of germanium and carbon in the second silicon layer 63 are set at 20% and 4%, respectively, and the thickness thereof is set at 10 nm.

On the third silicon layer 64, a gate insulating film 65 is formed out of a silicon dioxide film by thermally oxidizing the third silicon layer 64. On the gate insulating film 65, a gate electrode 66 is formed. On both sides below the gate electrode 66, source/drain regions 67 and 68 are formed as $p^+$ layers. And on the source/drain regions 67 and 68, source/drain electrodes 69 and 70 are formed, respectively. The holes moving through the second silicon layer 63, which is a channel region containing carbon and germanium and having received a tensile strain, are controlled by the voltage applied to the gate electrode 66.

As described above, the second silicon layer 63, containing carbon and germanium, receives a tensile strain and has almost no dislocations at the regions where the relationship between the compositions x, y of germanium and carbon is represented as x<8.2y and the thickness thereof is at the critical thickness Tc or less.

On the other hand, in $Si_{1-x-y}Ge_xC_y$, the degeneracy is also dissolved in the valence band, which is split into a light-hole band LH and a heavy-hole band HH. In this case, the edge of the valence band of $Si_{1-x-y}Ge_xC_y$ is the band consisting of light holes having a smaller effective mass. The effective mass of the light holes is smaller than that of holes in the first silicon layer 62. Comparing FIGS. 10(c) and 2(c) with each other, it is clear that the energy level difference between the light-hole band LH in the silicon layer ($Si_{1-x-y}Ge_xC_y$ layer) containing carbon and germanium and having received a tensile strain and the edge of the valence band in the silicon layer not containing any of these is larger than that between the light-hole band LH in the silicon layer ($Si_{1-y}C_y$ layer) containing carbon and having received a tensile strain and the edge of the valence band in the silicon layer not containing carbon. Thus, if the silicon layer ($Si_{1-x-y}Ge_xC_y$ layer) containing carbon and germanium and having received a tensile strain is used as a p-channel, a larger heterobarrier is formed as compared with using the silicon layer ($Si_{1-y}C_y$ layer) containing carbon and having received a tensile strain as a p-channel. Accordingly, holes are expectedly confined more effectively.

Figure 14A:
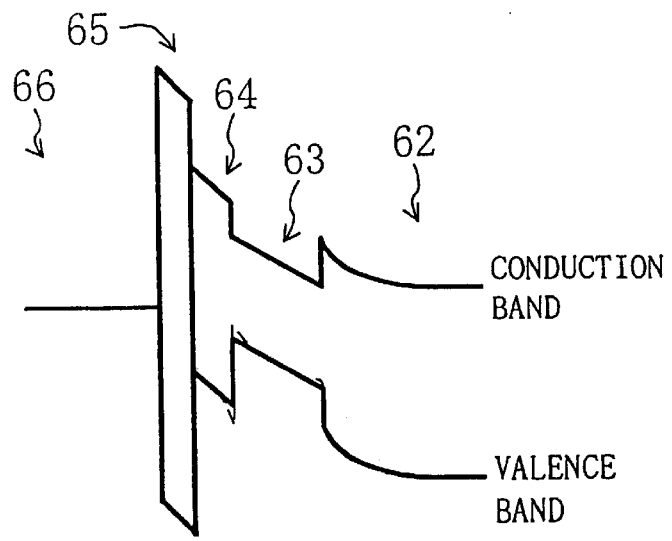
FIG. 14(a) is a band diagram where a negative voltage has been applied to the gate electrode of the p-MOSFET in the fifth embodiment.
Figure 14B:
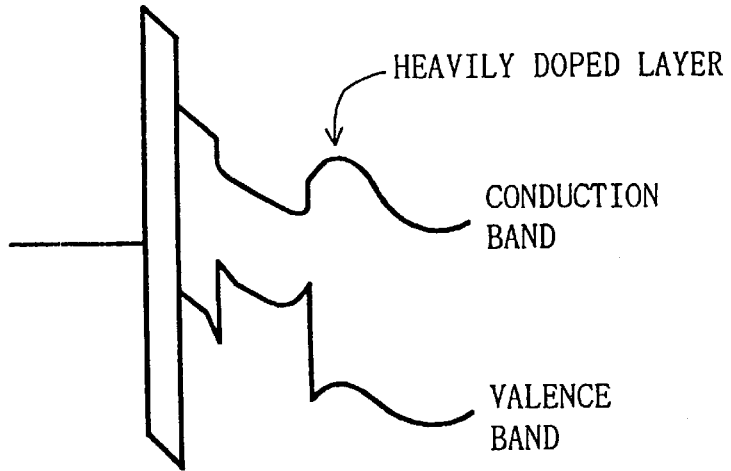
FIG. 14(b) is a band diagram where a heavily doped layer is further provided for the first silicon layer.
Figure 14C:
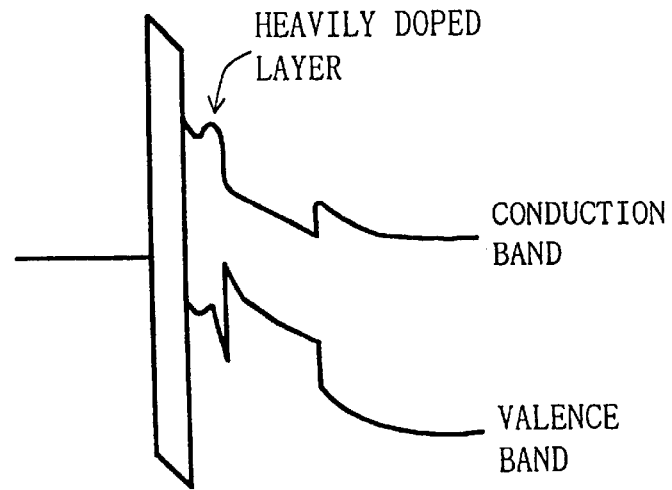
FIG. 14(c) is a band diagram where a heavily doped layer is further provided for the third silicon layer.

FIGS. 14(a) through 14(c) are diagrams illustrating the band structure of the first, second and third silicon layers 62, 63, 64, the gate insulating film 65 and the gate electrode 66, where the p-MOSFET shown in FIG. 13 is operated by applying a negative voltage to the gate electrode 66. In FIG. 14(a), the band structure is illustrated by the solid line in a simplified shape. However, in actuality, the edge of the valence band is shaped as indicated by the broken line in FIG. 14(a). FIG. 14(b) illustrates a band structure where a heavily doped layer is further provided for the first silicon layer 62, and FIG. 14(c) illustrates a band structure where a heavily doped layer is further provided for the third silicon layer 64. Holes, which have been induced by the electric field applied to the gate electrode 66, are mainly confined in the second silicon layer 63, which is a channel region containing carbon and germanium and having received a tensile strain. As a result, the holes move in a direction vertical to the paper sheet (i.e., a channel direction). That is to say, in this embodiment, holes are confined in the second silicon layer 63 by a heterobarrier formed between the first and second silicon layers 62, 63 and a heterobarrier formed between the second and third silicon layers 63, 64. And since the edge of the valence band in the second silicon layer 63 is a light-hole band LH having a smaller effective mass, the effective mass of the holes, moving in this direction, is small. As a result, the mobility of the holes and the operating speed of the transistor increase.

Furthermore, in this embodiment, a quantum well structure, in which the second silicon layer 63 as a channel region is interposed between the first and third silicon layers 62 and 64 having large band gaps, is formed. Thus, the induced holes are confined in the quantum well, do not get over the heterobarriers and move stably even when the density of holes is high. That is to say, a high-performance p-MOSFET having a quantum well structure can be provided using less expensive materials than compound semiconductors such as GaAs.

As can be understood, if the channel region of a p-MOSFET is formed out of the second silicon layer 63 containing carbon and germanium and having received a tensile strain, the operating speed of the p-MOSFET can be increased.

In this embodiment, a buried-channel MOSFET, in which the second silicon layer 63 is provided as a channel region, where holes move, under the third silicon layer 64, has been described. Alternatively, a surface-channel MOSFET, which does not include the third silicon layer 64 and in which the gate insulating film 65 is directly deposited or formed by thermal oxidation on the second silicon layer 63 as a channel region, may also be formed. Even in such a case, holes can also be confined in the second silicon layer 63 by the heterobarrier formed between the first and second silicon layers 62, 63 and the gate insulating film 65. And carriers can still be confined with higher efficiency than an ordinary MOSFET and the effective mass of light holes, formed by dissolved degeneracy, is still smaller than usual. Accordingly, the operating speed can be increased, too.

Moreover, an energy level well, where holes can be accumulated, is formed between the first and second silicon layers 62 and 63 as indicated by the broken line in FIG. 14(a). Another energy level well, where holes can be accumulated, is also formed between the second and third silicon layers 63 and 64.

And if a heavily doped layer, containing a high-concentration dopant for carriers, is formed in a region closer to the heterobarrier between the first and second silicon layers 62, 63, then one of the two energy level wells can be used as a carrier-accumulating layer. As a result, a so-called high electron mobility transistor (HEMT) may be formed (see FIG. 14(b)). In such a case, the heavily doped layer for supplying carriers is spatially separated from the channel functioning as a carrier-accumulating layer. Thus, the carriers, moving through the channel, are not scattered by the ionized impurities, and therefore can move at a high velocity.

However, in the energy band structure shown in FIG. 14(b), it depends on the level of the voltage applied to the gate electrode 66 which of the two wells constitutes a carrier-accumulating layer. Specifically, if the voltage applied to the gate electrode 66 is relatively high, the energy level well between the second and third silicon layers 63 and 64 constitutes a carrier-accumulating layer. Alternatively, if the voltage applied to the gate electrode 66 is relatively low, the energy level well between the first and second silicon layers 62 and 63 constitutes a carrier-accumulating layer. Furthermore, if the voltage applied to the gate electrode 66 is an intermediate value, any of these two energy level wells can be a carrier-accumulating layer.

On the other hand, if a heavily doped layer, containing a high-concentration dopant for carriers, is formed in a region closer to the heterobarrier between the second and third silicon layers 63, 64, then an HEMT, in which the energy level well between the second and third silicon layers 63, 64 constitutes a carrier-accumulating layer, is formed (see FIG. 14(c)). In such a case, the velocity of moving carriers can also be increased because of the same reason as that described above.

If the heavily doped layer is formed in the third silicon layer 64 (see FIG. 14(c)), the heavily doped layer itself might be a channel depending on specific operating conditions, i.e., the dopant concentrations and thicknesses of the respective silicon layers 62 to 64 and the heavily doped layer and the voltage applied to the gate electrode 66. Thus, the heavily doped layer may be selectively formed either in the first silicon layer 62 or the third silicon layer 64 in accordance with the structures of respective parts and the operating conditions of a field effect transistor.

Also, the energy level well (i.e., a portion indicated by the broken line in FIG. 14(a)) between the second and third silicon layers 63, 64 may be used as a channel, not as a carrier-accumulating layer. In such a case, a channel where holes move exists just under the third silicon layer 64, not under the gate insulating film 65. Consequently, as described in the second embodiment, a higher operating speed is ensured as compared with a general MOS transistor.

EMBODIMENT 6

Figure 15:
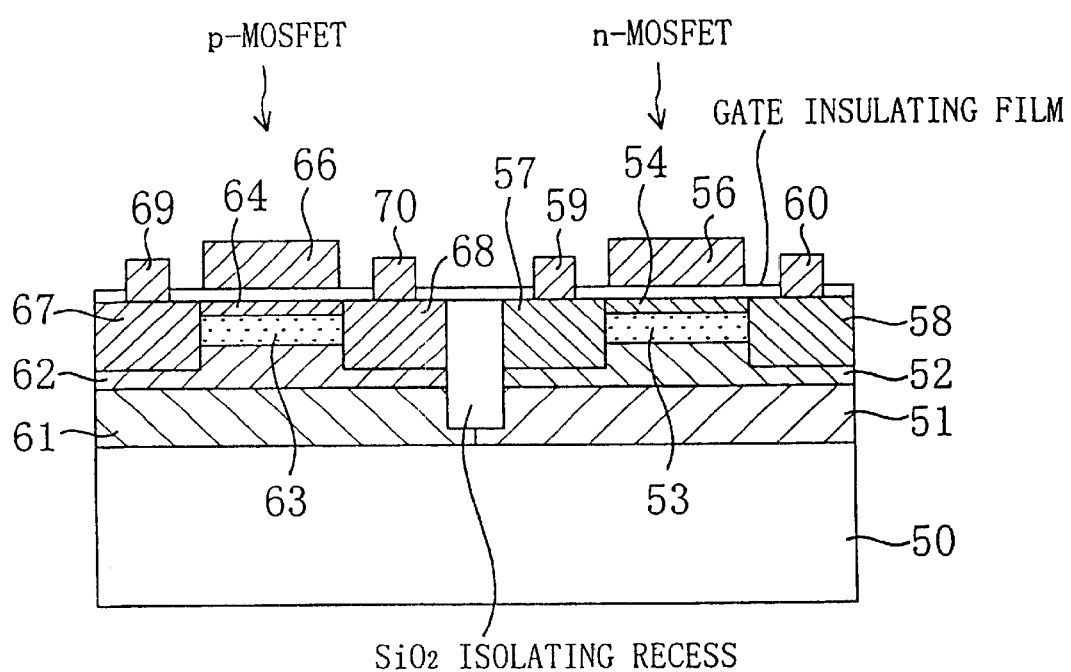
FIG. 15 is a cross-sectional view illustrating the structure of a CMOSFET, including n- and p-MOSFET's, of the sixth embodiment in which a second silicon layer, containing carbon and germanium and having received a tensile strain, is used as n- and p-channels.
Figure 16:
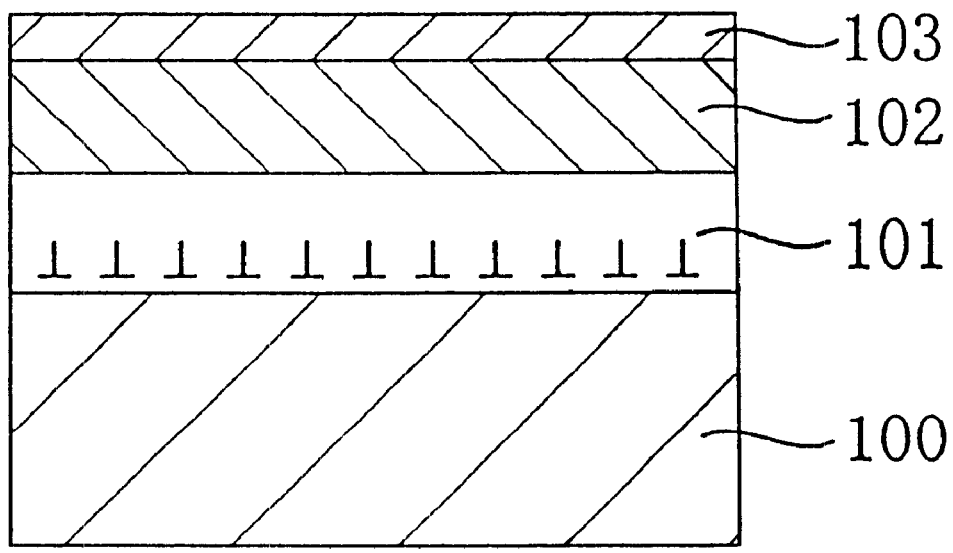
FIG. 16 is a cross-sectional view illustrating a conventional heterojunction structure in which a SiGe buffer layer, an $Si_{1-x}Ge_x$ layer, the lattice strain of which has been relaxed, and a silicon layer having received a tensile strain are formed on a silicon substrate.
Figure 17A:
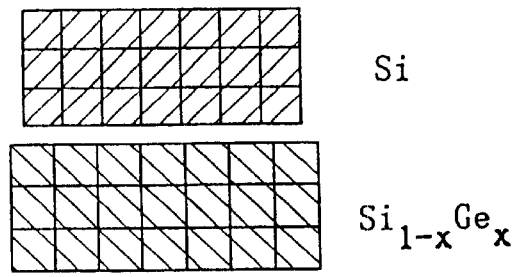
FIG. 17(a) is a crystal structure diagram illustrating the lattice states of $Si_{1-x}Ge_x$ and Si layers before these layers are stacked one upon the other in a conventional example.
Figure 17B:
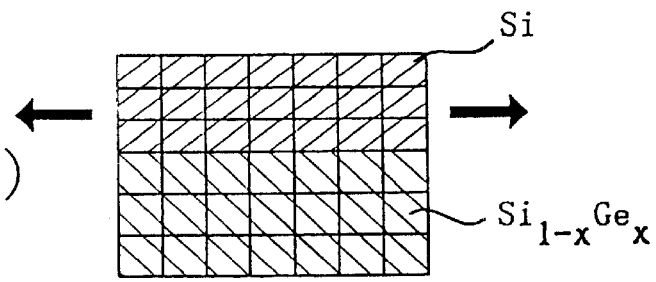
FIG. 17(b) is a crystal structure diagram illustrating a state where the Si layer has received a tensile strain after these layers have been stacked.
Figure 17C:
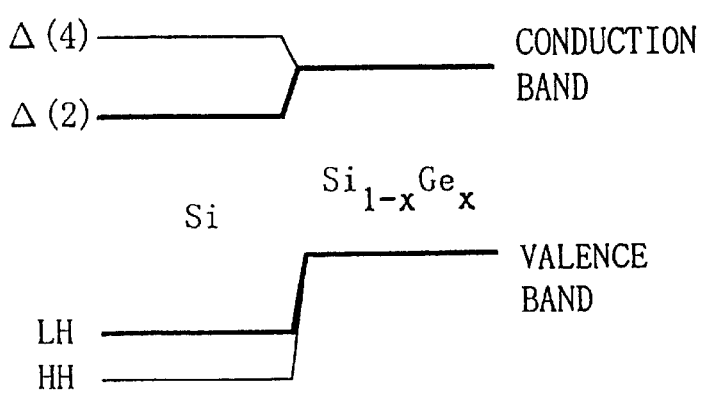
FIG. 17(c) is a band diagram illustrating a heterojunction structure of the $Si_{1-x}Ge_x$ and Si layers.

FIG. 15 is a cross-sectional view illustrating the structure of a CMOSFET of the sixth embodiment in which a silicon layer containing carbon and germanium is used as channel regions for respective MOSFETs.

The CMOSFET of this embodiment basically has a structure in which the n-MOSFET of the fourth embodiment and the p-MOSFET of the fifth embodiment are formed on the silicon substrate 50 to be adjacent to each other via an $SiO_2$ isolating well therebetween. As shown in FIG. 15, a p-well 51 is formed under the n-MOSFET and an n-well 61 is formed under the p-MOSFET.

In the n-MOSFET, the first silicon layer 52, the second silicon layer 53 made of $Si_{1-x-y}Ge_xC_y$ containing carbon and germanium, and the third silicon layer 54 not containing carbon or germanium are stacked in this order by a UHV-CVD technique on the p-well 51. The second silicon layer 53 containing carbon and germanium functions as a channel region where electrons move. The second silicon layer 53 receives a tensile strain, and the thickness thereof is preferably set at the critical thickness Tc or less such that dislocations are not generated because of a strain. Accordingly, in this embodiment, the compositions of germanium and carbon in the second silicon layer 53 are set at 20% and 4%, respectively, and the thickness thereof is set at 10 nm. On the third silicon layer 54, a gate insulating film is formed out of a silicon dioxide film by thermally oxidizing the third silicon layer 54. On the gate insulating film, a gate electrode 56 is formed. On both sides below the gate electrode 56, source/drain regions 57 and 58 are formed as $n^+$ layers. And on the source/drain regions 57 and 58, source/drain electrodes 59 and 60 are formed, respectively.

On the other hand, in the p-MOSFET, the fourth silicon layer 62, the fifth silicon layer 63 made of $Si_{1-x-y}Ge_xC_y$ containing carbon and germanium, and the sixth silicon layer 64 not containing carbon or germanium are stacked in this order by a UHV-CVD technique on the n-well 61. The fifth silicon layer 63 containing carbon and germanium functions as a channel region where holes move. In the p-MOSFET, the compositions of germanium and carbon in the fifth silicon layer 63 are also set at 20% and 4%, respectively. And the thickness thereof is set at 10 nm. That is to say, the second silicon layer 53 of the n-MOSFET and the fifth silicon layer 63 of the p-MOSFET are of mutually opposite conductivity types, but have the same composition. On the sixth silicon layer 64, a gate insulating film is formed out of a silicon dioxide film by thermally oxidizing the sixth silicon layer 64. On the gate insulating film, a gate electrode 66 is formed. On both sides below the gate electrode 66, source/drain regions 67 and 68 are formed as $p^+$ layers. And on the source/drain regions 67 and 68, source/drain electrodes 69 and 70 are formed, respectively. It is noted that the second silicon layer 52 of the n-MOSFET and the fourth silicon layer 62 of the p-MOSFET have the same composition and that the third silicon layer 54 of the n-MOSFET and the sixth silicon layer 64 of the p-MOSFET also have the same composition.

In this embodiment, in both the n- and p-MOSFET's, channel regions where carriers move are formed of the second and fifth silicon layers 53, 63 both containing carbon and germanium and having received a tensile strain.

As described in the fourth and fifth embodiments, the energy level at the edge of the conduction band in the second and fifth silicon layers 53, 63 containing carbon and germanium and having received a tensile strain is lower than that of the first and fourth silicon layers 52, 62 not containing carbon or germanium. On the other hand, the energy level at the edge of the valence band in the second and fifth silicon layers 53, 63 is higher than that of the first and fourth silicon layers 52, 62. Thus, heterobarriers for confining carriers in the second and fifth silicon layers 53, 63 are formed in both the conduction and valence bands. Accordingly, channel regions for confining both electrons and holes can be formed.

In a conventional CMOSFET mainly composed of SiGe/Si and using a heterojunction structure (see Japanese Laid-Open Publication No. 61-282278, for example), a heterobarrier for confining electrons and holes in channel regions cannot be made of a single composition. Thus, n- and p-channel regions must be made of different compositions and these regions must be stacked one upon the other. However, in such a structure, the crystal growing process is adversely complicated and the throughput might decrease. Also, the lower one of the n- and p-channel regions is more distant from a gate insulating film. Thus, even if a voltage is applied to the gate, an electric field having a sufficiently high intensity might not reach the lower channel region. Moreover, since a thick buffer layer is indispensable for reducing the lattice strain, the conventional structure has problems in terms of reliability and throughput as mentioned above.

By contrast, in this embodiment, heterobarriers for confining carriers in the $Si_{1-x-y}Ge_xC_y$ layer are formed in both the conduction and valence bands of the $Si_{1-x-y}Ge_xC_y$ layer, which is formed on the Si layer and has received a tensile strain. Thus, the $Si_{1-x-y}Ge_xC_y$ layer can be used both as n- and p-channels. In other words, the n- and p-channels, where electrons and holes respectively move at high velocities, can be formed in the second and fifth silicon layers 53 and 63, respectively. As a result, in either the n- or p-MOSFET, the second or fifth silicon layer 53, 63 to be a channel region can be formed in the vicinity of the gate insulating film. Accordingly, an electric field produced by the voltage applied to the gate electrode 56, 66 can be applied to the channel region with much more certainty. Furthermore, unlike the prior art, no thick buffer layer is required for reducing the lattice strain. Consequently, the crystal growing process step can be simplified during the fabrication process and the reliability and throughput can be improved.

Also, the energy level difference between the light-hole band LH in the silicon layer ($Si_{1-x-y}Ge_xC_y$ layer) containing carbon and germanium and having received a tensile strain and the edge of the valence band in the silicon layer not containing any of these is larger than that between the light-hole band LH in the silicon layer ($Si_{1-y}C_y$ layer) containing carbon and having received a tensile strain and the edge of the valence band in the silicon layer not containing carbon. Thus, a larger heterobarrier is formed in the p-MOSFET in the CMOSFET of this embodiment than in the p-MOSFET in the CMOSFET of the third embodiment. Accordingly, holes are expectedly confined more effectively.

In particular, by changing the compositions of carbon and germanium, the ratio of the height of the heterobarrier formed at the edge of the conduction band to the height of the heterobarrier formed at the edge of the valence band can be controlled at a desired value. Thus, if the second silicon layer 53 of the n-MOSFET and the fifth silicon layer 63 of the p-MOSFET shown in FIG. 15 are formed out of the same layer, both electrons and holes can be confined very efficiently. This is because the n-MOSFET operates with the energy band shown in FIG. 11 and the p-MOSFET operates with the energy band shown in FIG. 14.

OTHER EMBODIMENTS

In the foregoing embodiments, it is assumed that no impurity other than the dopant for carriers is contained in the first and third silicon layers. However, the present invention is not limited to such embodiments. In the first and third silicon layers, carbon or germanium may be slightly contained. This is because the effects of the present invention can be attained if only the second silicon layer receives a tensile strain from the first silicon layer.

In the foregoing embodiments, the present invention has been described as being applied to a MOSFET. Alternatively, the heterobarrier structure of the present invention is also applicable to a field effect transistor having a Schottky gate structure.

In the semiconductor device of the present invention, a first silicon layer and a second silicon layer, containing carbon and having received a tensile strain from the first silicon layer, are stacked one upon the other in a field effect transistor, thereby making the second silicon layer function as the channel region of the field effect transistor. Thus, by utilizing band splitting at the conduction or valence band of the second silicon layer having received a tensile strain, a high-speed-operating n-type or p-type field effect transistor using electrons or holes having a smaller effective mass can be obtained. The properties of the second silicon layer can be improved, because almost no dislocations are generated in the second silicon layer even if the thickness thereof is reduced. Also, since no thick buffer layer is required for reducing the lattice strain, the fabrication costs can be cut down.

Moreover, heterobarriers for confining carriers in the second silicon layer are formed in both the conduction and valence bands of the second silicon layer in the vicinity of heterojunctions. Thus, a CMOSFET exhibiting excellent performance characteristics can be provided, because excellent field effects are attained in both the n- and p-MOSFET's.

Furthermore, if the second silicon layer contains carbon and germanium, then holes can be confined even more effectively in the p-MOSFET. This is because the energy level of the LH band increases more in the silicon layer containing carbon and germanium and having received a tensile strain than in the silicon layer containing carbon and having received a tensile strain.

What is claimed is:

1. A semiconductor device comprising an n-channel and a p-channel field effect transistor on a substrate, wherein the n-channel field effect transistor includes:
   a first silicon layer formed on a substrate;
   a first SiGeC layer in which an n-channel is formed, and which is formed on the first silicon layer, contains carbon and germanium and has received a tensile strain from the first silicon layer; and
   a gate electrode formed over the first SiGeC layer, the p-channel field effect transistor including:
   a second silicon layer formed on a substrate;
   a second SiGeC layer in which a p-channel is formed, and which is formed on the second silicon layer, contains carbon and germanium and has received a tensile strain from the second silicon layer; and
   a gate electrode formed over the second SiGeC layer, wherein the semiconductor device functions as a complementary device.

2. The semiconductor device of claim 1, wherein electrons are confined by a heterobarrier formed between the first silicon layer and the first SiGeC layer of the n-channel field effect transistor; and holes are confined in the second SiGeC layer of the p-channel field effect transistor.

3. The semiconductor device of claim 1, further comprising a heavily doped layer which is formed in the first silicon layer in the vicinity of the first SiGeC layer and contains a high-concentration n-type dopant; and a heavily doped layer which is formed in the second silicon layer in the vicinity of the second SiGeC layer and contains a high-concentration p-type dopant.

4. The semiconductor device of claim 2, wherein the first SiGeC layer is a quantum well.

5. The semiconductor device of claim 1, further comprising a third silicon layer which is formed on the first SiGeC layer and under the gate electrode and applies a tensile strain to the first SiGeC layer; and a fourth silicon layer which is formed on the second SiGeC layer and under the gate electrode and applies a tensile strain to the second SiGeC layer, wherein electrons are confined in the first SiGeC layer by a heterobarrier formed in a boundary between the first SiGeC layer and the third silicon layer, and wherein holes are confined in the second SiGeC layer by a heterobarrier formed in a boundary between the second SiGeC layer and the fourth silicon layer.

6. The semiconductor device of claim 1, further comprising a heavily doped layer which is formed in the third silicon layer in the vicinity of the first SiGeC layer and contains a high-concentration n-type dopant; and a heavily doped layer which is formed in the fourth silicon layer in the vicinity of the second SiGeC layer and contains a high-concentration p-type dopant.

7. The semiconductor device of claim 1, further comprising a gate insulating film formed under an n-gate electrode and a second gate insulating film formed under a p-gate electrode.

8. The semiconductor device of claim 1, wherein the thickness of the first SiGeC layer is smaller than a critical thickness which is determined by the composition of carbon and above which dislocations are generated.

* * * * *

UNITED STATES PATENT AND TRADEMARK OFFICE
CERTIFICATE OF CORRECTION

PATENT NO.    : 6,472,685 B2
DATED         : October 29, 2002
INVENTOR(S)   : Takeshi Takagi It is certified that error appears in the above-identified patent and that said Letters Patent is hereby corrected as shown below:

<u>Title page,</u>
Item [57], ABSTRACT,
Line 1, please delete "($Si_1C_y$" and add -- ($Si_{1-y}C_y$ --

Signed and Sealed this

First Day of July, 2003

JAMES E. ROGAN
*Director of the United States Patent and Trademark Office*